(12) United States Patent
Nagai et al.

(10) Patent No.: US 8,212,145 B2
(45) Date of Patent: Jul. 3, 2012

(54) CIRCUIT UNIT ACCOMMODATION BOX

(75) Inventors: Ryuichi Nagai, Aichi (JP); Takahiro Sugiyama, Aichi (JP); Yuchi Yamanouchi, Aichi (JP)

(73) Assignees: Toyota Jidosha Kabushiki Kaisha, Aichi (JP); Daiwa Kasei Industry Co., Ltd., Okazaki (JP); Tyco Electronics Japan G.K., Kanagawa-Ken (JP)

(*) Notice: Subject to any disclaimer, the term of this patent is extended or adjusted under 35 U.S.C. 154(b) by 347 days.

(21) Appl. No.: 12/442,342

(22) PCT Filed: Aug. 8, 2007

(86) PCT No.: PCT/JP2007/066671
§ 371 (c)(1),
(2), (4) Date: Mar. 20, 2009

(87) PCT Pub. No.: WO2008/035548
PCT Pub. Date: Mar. 27, 2008

(65) Prior Publication Data
US 2010/0025067 A1    Feb. 4, 2010

(30) Foreign Application Priority Data
Sep. 20, 2006 (JP) ................. 2006-254203

(51) Int. Cl.
*H01R 13/62* (2006.01)
*H01R 13/629* (2006.01)
*H01R 13/639* (2006.01)

(52) U.S. Cl. ............ 174/59; 174/50; 439/246; 439/247; 439/248; 439/296; 439/374

(58) Field of Classification Search ............... 174/50.52, 174/59, 535, 563, 520, 50; 361/608, 616, 361/727, 714, 724, 796; 439/540.1, 76.1, 439/460, 374, 535, 246–248, 296, 310, 350–357
See application file for complete search history.

(56) References Cited

U.S. PATENT DOCUMENTS
2,050,323 A * 8/1936 Hobbs et al. .................. 361/615
(Continued)

FOREIGN PATENT DOCUMENTS
EP    0823834 A2    2/1998
(Continued)

OTHER PUBLICATIONS

Supplementary European Search Report dated Sep. 9, 2011, U.S. Appl. No. 07806149.6-1242 / 2075162 PCT/JP2007066671, Applicant Tyco Electronics Japan G.K., et al., 8 pages.

*Primary Examiner* — Angel R Estrada
*Assistant Examiner* — Dimary Lopez
(74) *Attorney, Agent, or Firm* — Barley Snyder

(57) ABSTRACT

It is an object of the present invention to provide a circuit unit accommodation box having receptacles, with the circuit unit accommodation box being able to reliably accommodate a circuit unit having a first connector and also allowing the worker to attach the circuit unit to the circuit unit accommodation box with a simple operation when the circuit unit is to be accommodated in the circuit unit accommodation box. The circuit unit accommodation box includes a box body and a receptacle. The box body includes at least one circuit unit accommodating recess into which a circuit unit, equipped with a first connector, is inserted. The receptacle is disposed in the circuit unit accommodating recess and provides an electrical connection with the inserted circuit unit. The box body and the circuit unit are equipped with a securing mechanism for holding the circuit unit in the box body when the circuit unit is inserted from a first position to a second position.

7 Claims, 25 Drawing Sheets

U.S. PATENT DOCUMENTS

| | | |
|---|---|---|
| 5,134,546 A * | 7/1992 | Izumi et al. .................... 361/736 |
| 5,788,522 A | 8/1998 | Kameyama |
| 6,045,410 A * | 4/2000 | Norizuki et al. .............. 439/701 |
| 6,217,358 B1 | 4/2001 | Norizuki et al. |
| 6,582,256 B2 * | 6/2003 | Sakurai et al. ................ 439/701 |
| 6,666,715 B2 * | 12/2003 | Fujita et al. ................ 439/540.1 |
| 6,962,499 B2 * | 11/2005 | Yamamoto et al. .......... 439/76.2 |
| 7,125,290 B2 * | 10/2006 | Martin et al. ................. 439/701 |
| 7,190,589 B2 * | 3/2007 | Caines et al. ................. 361/707 |
| 2005/0112940 A1 * | 5/2005 | Naganishi .................. 439/540.1 |

FOREIGN PATENT DOCUMENTS

| | | |
|---|---|---|
| JP | 11-054210 | 2/1999 |
| JP | 2001-148267 | 5/2001 |
| JP | 2002-246106 | 8/2002 |
| JP | 2003-324824 | 11/2003 |
| JP | 2006-137234 | 6/2006 |

* cited by examiner

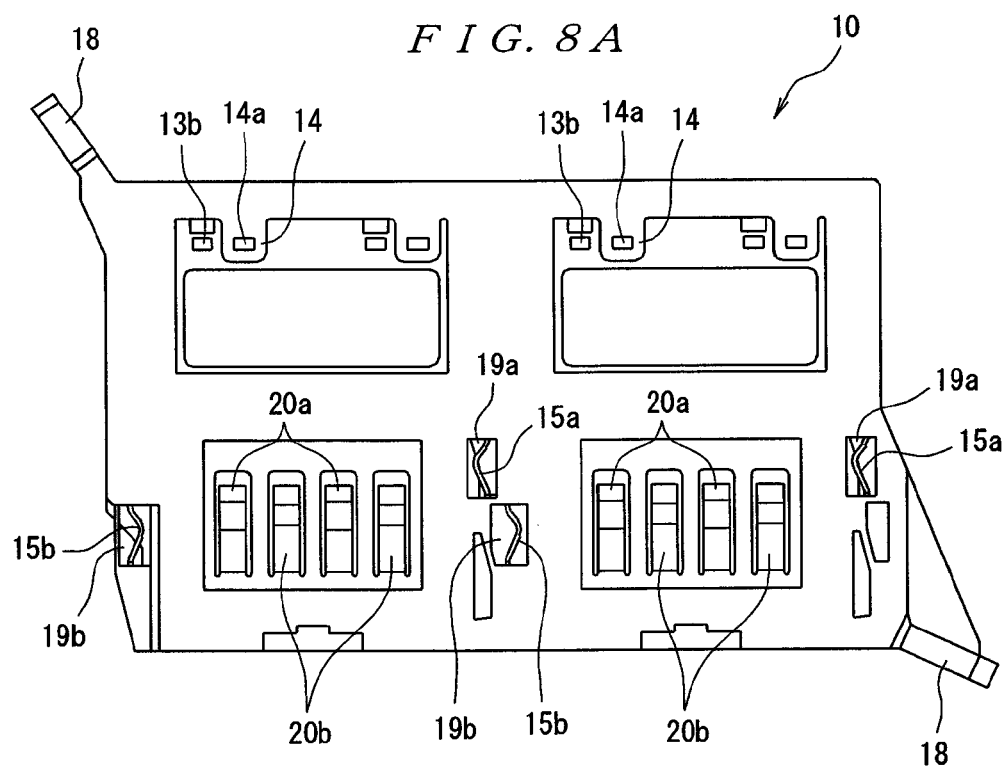
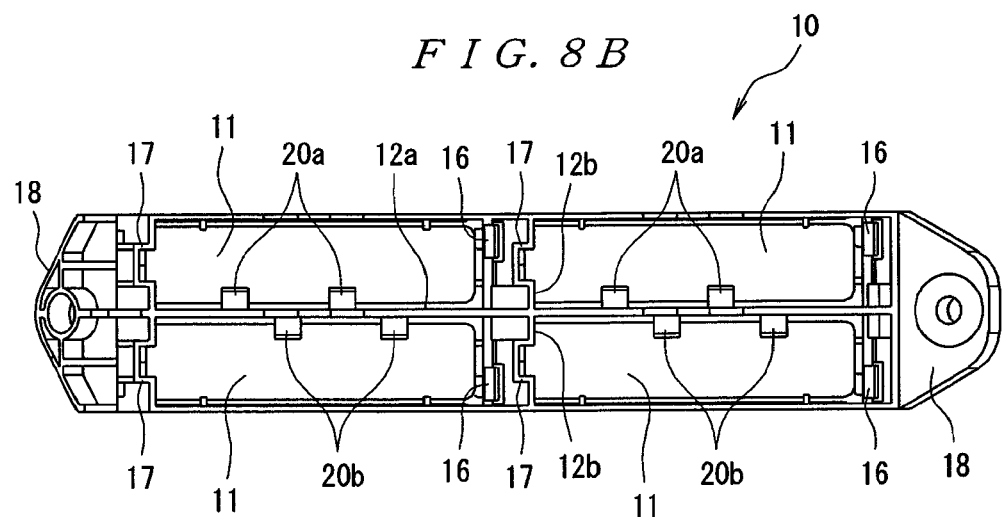

PRIOR ART

PRIOR ART

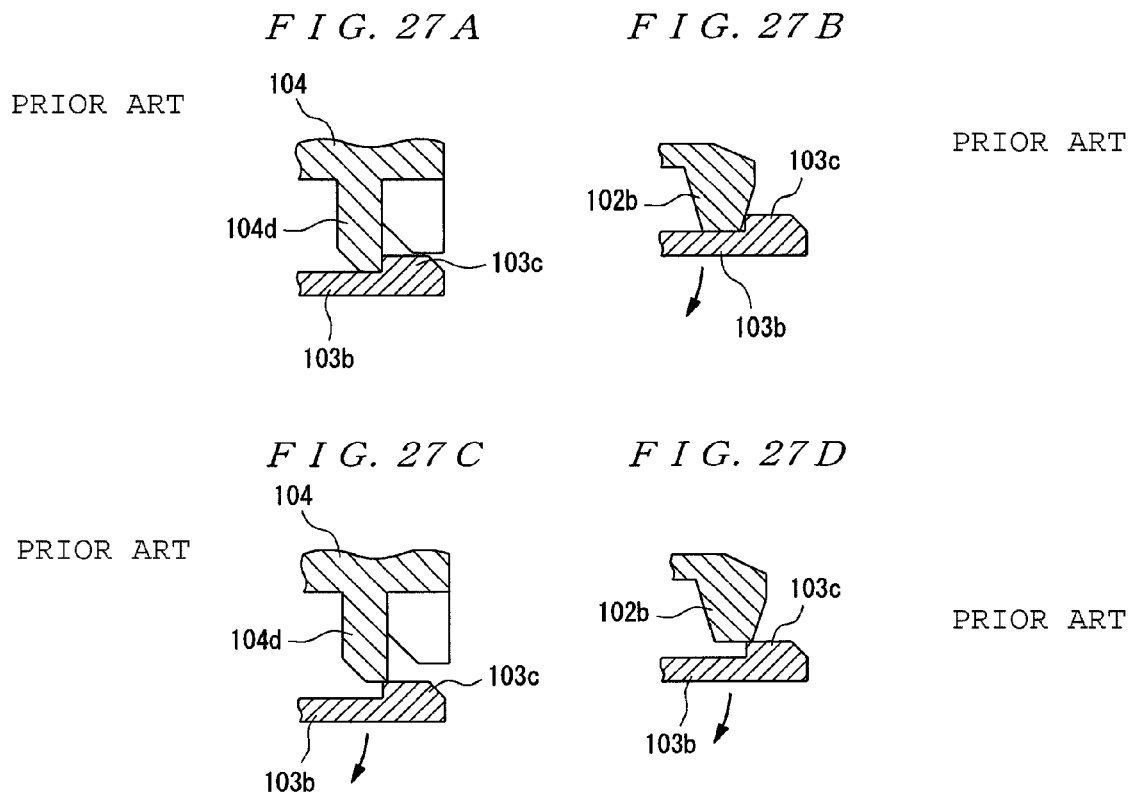

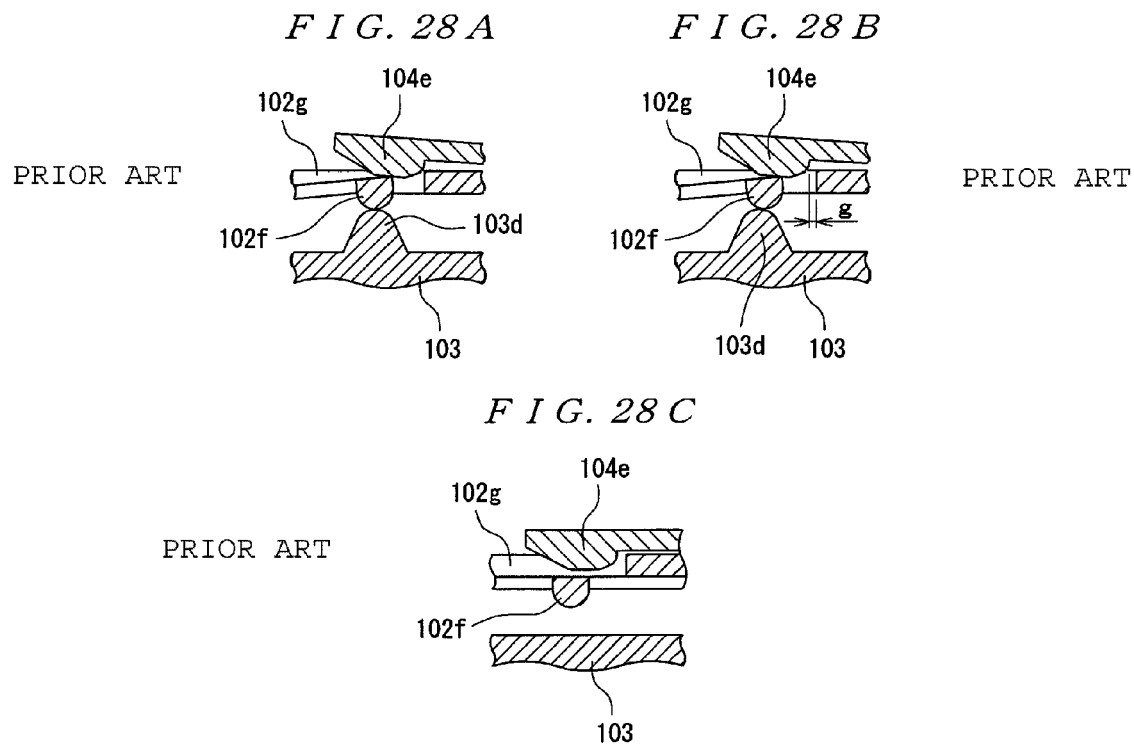

CIRCUIT UNIT ACCOMMODATION BOX

CROSS-REFERENCE TO RELATED APPLICATIONS

This application is a National Stage Application filed under 35 U.S.C. §371 of PCT/JP2007/066671, filed on Aug. 28, 2007, which claims priority of Japanese Application No. 2006-254203, filed Sep. 20, 2006.

FIELD OF THE INVENTION

The present invention relates to a circuit unit accommodation box into which a circuit unit, such as an ECU, having an electrical connector is inserted.

BACKGROUND

In recent years, there has been an increased demand in the automotive field for accommodating and attaching, in a centralized and comprehensive manner, a plurality of circuit units such as ECUs having electrical connectors (first connectors) in a circuit unit accommodation box that is mounted in advance on the side of a vehicle.

Here, a connector device shown in FIGS. 19 through 28C (see JP2002-246106A), for example, is a known connector device combining a first structural body, such as a circuit unit having a first connector, and a second structural body having a receptacle connector that connects with the first connector. FIG. 19 is a perspective view of the assembly of a conventional example of a connector device having a receptacle connector. FIG. 20 is a sectional view illustrating a state in which the second connector is accommodated in the receptacle shown in FIG. 19. FIG. 21 is a sectional view along line 21-21 in FIG. 20. FIG. 22 is an explanatory diagram of the connector device shown in FIG. 21 at an intermediate point during mating. FIG. 23 is a sectional view along line 23-23 in FIG. 22. FIG. 24 is an explanatory diagram of the connector device shown in FIG. 22 at an intermediate point during mating. FIG. 25 is a sectional view along line 25-25 in FIG. 24. FIG. 26 is an explanatory diagram of the completed state of mating of the connector device shown in FIG. 24. FIGS. 27A through 27D are the illustrative diagrams showing the relationship between locking mechanism and unlocking mechanism in the assembly consisting of the first connector, receptacle part, and second connector. FIGS. 28A through 28C are the illustrative diagrams showing the relationship between locking mechanism for locking the first connector and second connector and unlocking mechanism.

The connector device 101 shown in FIG. 19 is designed to combine a first structural body (not shown in the figures), such as a circuit unit having a first connector 102, and a second structural body (not shown in the figures) having a receptacle 105 that connects with the first connector 102.

Here, the first connector 102 is formed in a substantially rectangular flattened shape, and has an opening 102a that receives a mating part 104a of the second connector 104 at the front end (right end in FIG. 20), as shown in FIG. 20. Pairs of unlocking keys (unlocking mechanism) 102b are respectively provided on two surfaces of the first connector 102 (one pair on the upper surface and the other pair on the lower surface) at the front ends thereof. Furthermore, as is shown in FIGS. 19 and 20, a pair of unlocking ribs (unlocking mechanism) 102d are provided with one rib being provided on either side surface of the first connector 102. Each unlocking rib 102d is constructed from a pair of upper and lower ribs 102e that extend from the rear end side toward the center and a projection 102f that links the front end portions of these ribs 102e and that protrudes outward in a semi-circular shape. Moreover, engaging windows 102g that open into the opening 102a are formed in both side surfaces of the first connector 102 corresponding to the projections 102f of the unlocking ribs 102d. In addition, attachments 102h, for the first structural body, are provided at four corners of the rear end portion of the first connector 102.

Furthermore, the receptacle 105 includes a receptacle housing 103, which is fastened to a second structural body (not shown in the figures), and a second connector 104 that is accommodated in the receptacle housing 103. The second connector 104 makes a mating connection with the first connector 102 when the first structural body and second structural body are assembled together.

As is shown in FIGS. 19 and 20, the second connector 104 includes a substantially rectangular mating part 104a that is received in the opening 102a of the first connector 102 and a flange 104b that is provided on the rear portion (right portion in FIG. 20) of the mating part 104a. The second connector 104 is designed to be attached inside a through-hole 103a of the receptacle housing 103 from the rear. Cutouts 104c, each allowing the passage of two unlocking keys 102b, are respectively formed in the upper and lower central portions of the flange 104b. Moreover, locking projections 104d respectively protrude from both upper and lower surfaces of the second connector 104, in the vicinity of the cutouts 104c. Each locking projection 104d can pass between two unlocking keys 102b. Moreover, locking members (locking mechanism) 104e, which respectively engage with the engaging windows 102g in the first connector 102 and thus lock the first connector 102 and second connector 104, are provided on both side surfaces of the mating part 104a of the second connector 104. A pair of projections 104f is provided with one projection protruding from either side surface of the flange 104b of the second connector 104.

In addition, as is shown in FIGS. 19 and 20, the receptacle housing 103 is formed in a substantially rectangular shape, and is provided with a through-hole 103a that passes through, in the front-back direction (left-right direction in FIG. 20) and that accommodates the second connector 104 on the inside. A pair of mutually facing locking spring ribs (locking mechanism) 103b are provided in the center of either surface (upper and lower surfaces) of the receptacle housing 103. As is shown in FIG. 21, locking claws 103c protrude inward from the rear ends of the respective locking spring ribs 103b. Furthermore, as is shown in FIG. 20, projections 103d, used as an unlocking mechanism, are provided on the respective inner surfaces of both side walls of the receptacle housing 103. Moreover, attachment parts 103e for the second structural body are provided on the lower end portions of both side walls of the receptacle housing 103. In addition, a pair of cutouts 103f, with which the projections 104f of the second connector 104 are locked, are formed in the rear surface of either side wall of the receptacle housing 103.

Next, the actions of the respective constituent elements in the connector device 101 will be described.

As is shown in FIGS. 20 and 21, when the second connector 104 is inserted into the through-hole 103a from the rear end of the receptacle housing 103, the locking projections 104d of the second connector 104 respectively push the locking spring ribs 103b of the receptacle housing 103 outward, so that the tip ends of the locking projections 104d are locked in by the locking claws 103c, and the projections 104f of the second connector 104 are locked with the cutouts 103f in the receptacle housing 103. As a result, the second connector 104 is accommodated and held inside the through-hole 103a in the receptacle housing 103, thus completing a receptacle 105.

Furthermore, when the first structural body, having the first connector 102, is moved in the direction of arrow A, shown in FIGS. 20 and 21, the front end of the first connector 102 is inserted into the through-hole 103a of the receptacle housing 103 of the receptacle 105. Meanwhile, the locking members 104e of the second connector 104 are inserted into the opening 102a in the first connector 102, the first connector 102 slides inside the through-hole 103a, and the mating of the two connectors 102 and 104 is initiated. Then, the first connector 102 further slides inside the through-hole 103a, so that the first connector 102 and second connector 104 are placed in the state at an intermediate point during mating, as shown in FIGS. 22 and 23. In this state, and as shown in FIG. 27B, the unlocking keys 102b of the first connector 102 make contact with the locking claws 103c of the receptacle housing 103, so that the locking parts 104d of the second connector 104 are left locked in by the locking claws 103c of the receptacle housing 103, as shown in FIG. 27A. The second connector 104 is left accommodated and held inside the through-hole 103a in the receptacle housing 103. In this state, furthermore, the projections 102f of the unlocking ribs 102d of the first connector 102 are pressed inward by the projections 103d of the receptacle housing 103, as shown in FIG. 28A. As a result, the locking members 104e of the second connector 104 are displaced inward, so that these locking members 104e are not completely engaged with the engaging windows 102g. Accordingly, the first connector 102 and second connector 104 are not locked together.

When the first structural body, having the first connector 102, moves further from this state by the gap g in FIG. 28B in the direction of arrow A, shown in FIGS. 20 and 21, the first connector 102 and second connector 104 are placed in the state immediately prior to the mating completion shown in FIGS. 24 and 25. In this state, as is shown in FIG. 27D, the unlocking keys 102b of the first connector 102 respectively push the locking spring ribs 103b of the receptacle housing 103 outward, so that the locking parts 104d of the second connector 104 is unlocked from the locking claws 103c of the receptacle housing 103, as shown in FIG. 27C. In this state, furthermore, the projections 102f of the unlocking ribs 102d of the first connector 102 are left pressed inward by the projections 103d of the receptacle housing 103, as shown in FIG. 28B. As a result, the locking members 104e of the second connector 104 are displaced inward, so that these locking members 104e are not completely engaged with the engaging windows 102g. Consequently, the first connector 102 and second connector 104 are not locked together.

Then, when the first structural body, having the first connector 102, is moved further in the direction of arrow A shown in FIGS. 20 and 21, the pressed state of the projections 102f of the unlocking ribs 102d by the projections 103d of the receptacle housing 103 is released as shown in FIG. 28C, so that the locking members 104e of the second connector 104 are completely engaged with the engaging windows 102g, and the first connector 102 and second connector 104 are locked together, thus completing the mating of the two connectors 102 and 104. Moreover, the front end of the first connector 102 presses the flange 104b of the second connector 104, so that the state shown in FIG. 26 is created. In this state, as shown in FIG. 26, it is possible to prevent the transmission of vibration on the side of the second structural body attached to the receptacle housing 103 to the second connector 104 because the second connector 104 is away from the inner wall surfaces of the receptacle housing 103. Therefore, such a construction prevents the generation of vibration stress or noise caused by the vibration.

However, several problems are encountered with this conventional connector device 101.

Specifically, with regard to the connector device 101, there is no specific disclosure as to how the first structural body, having the first connector 102, is combined with, held by, and attached to the second structural body having the receptacle 105. In addition, there is no specific disclosure as to the timing with which the first structural body is combined, held, and attached. For this reason, the connector device 101 cannot be applied to a construction in which a circuit unit, having the first connector, is accommodated in a circuit unit accommodation box having a receptacle connector, which has been a demand in recent years in the automotive field.

Furthermore, in the accommodation of a circuit unit into a circuit unit accommodation box, it is desirable that the worker be able to attach the circuit unit to the circuit unit accommodation box with a simple operation, and easily realize the completion of the attachment of the circuit unit to the circuit unit accommodation box by sensation.

SUMMARY

Accordingly, it is an object of the present invention to provide a circuit unit accommodation box having a receptacle, wherein the circuit unit accommodation box can reliably accommodate a circuit unit having a first connector, and in the accommodation of the circuit unit into the circuit unit accommodation box, the worker can attach the circuit unit to the circuit unit accommodation box with a simple operation, while also easily perceiving the completion of the attachment of the circuit unit to the circuit unit accommodation box by sensation.

In order to solve the problems described above, a circuit unit accommodation box has a box body and a receptacle. The box body includes at least one circuit unit accommodating recess into which a circuit unit equipped with a first connector is inserted. The receptacle is disposed in the circuit unit accommodating recess and makes an electrical connection with the inserted circuit unit. The receptacle includes a cover, for receiving the circuit unit and guiding the circuit unit to a specified position, and a second connector that is accommodated inside the cover and locked with the cover by a locking projection such that the second connector mates with the first connector and establishes electrical connection with the first connector when the received circuit unit is inserted into a first position. A release projection is further included in order to release the second connector from the locking projection. This is performed when the circuit unit is inserted from the first position into a position further toward the interior with the second connector becoming slidable inside the cover in the direction of insertion and withdrawal of the circuit unit after the second connector is released by the release mechanism. Additionally, a securing mechanism, on the box body and the circuit unit, is provided in order to hold the circuit unit in the box body when the circuit unit is inserted from the first position to a second position via the interior position.

BRIEF DESCRIPTION OF THE DRAWINGS

FIGS. 8A and 8B show the box body, with FIG. 8A being a plan view, and FIG. 8B being a front view;

FIGS. 27A through 27D are illustrative sectional views showing the relationship between a locking mechanism and release mechanism in the assembly consisting of the first connector, receptacle part, and second connector; and FIGS. 28A through 28C are illustrative sectional views showing the relationship between locking mechanism for locking the first connector and second connector and unlocking mechanism.

DETAILED DESCRIPTION OF THE EMBODIMENT(S)

Figure 1:
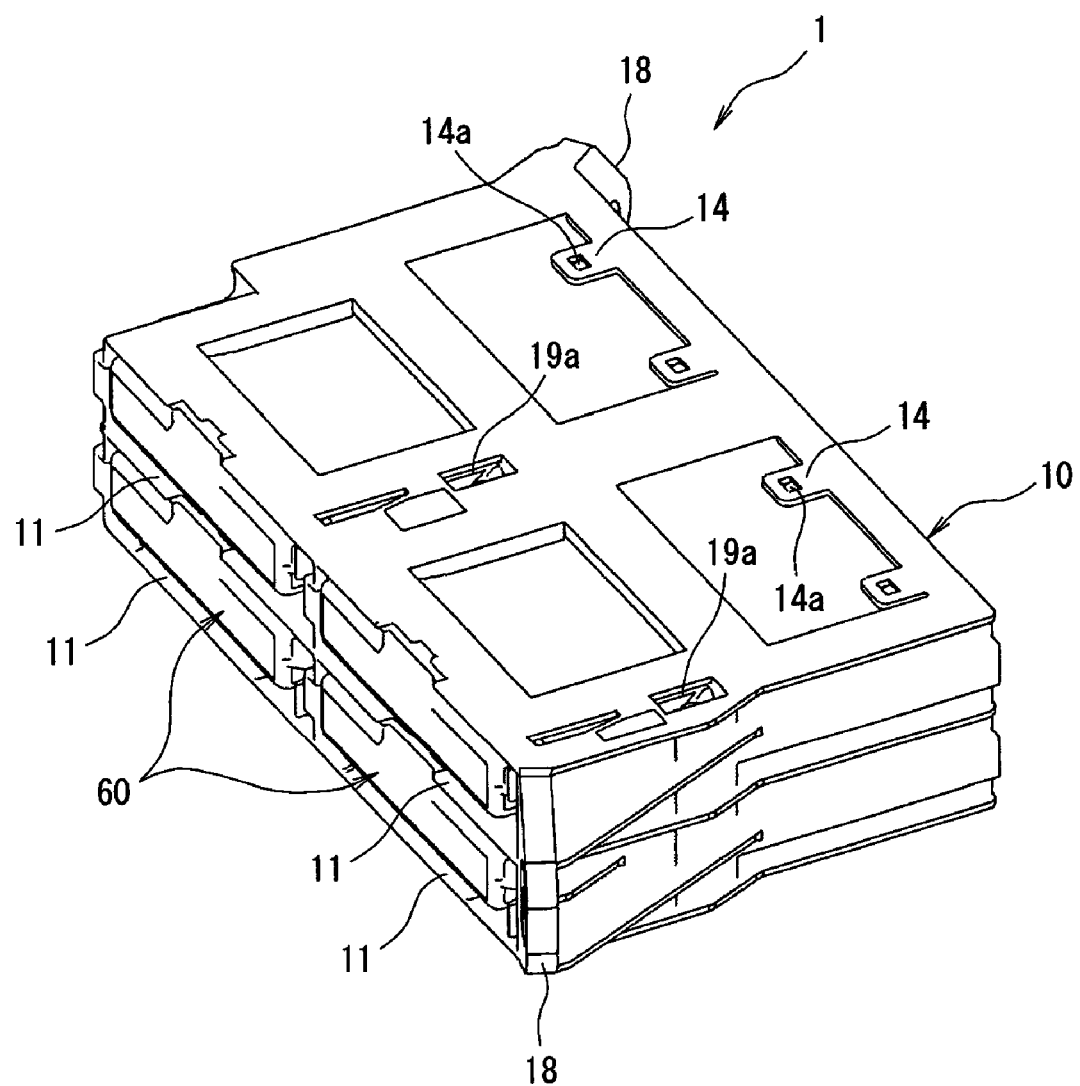
FIG. 1 is a perspective view showing a state in which circuit units are accommodated in a circuit unit accommodation box of the present invention.
Figure 2:
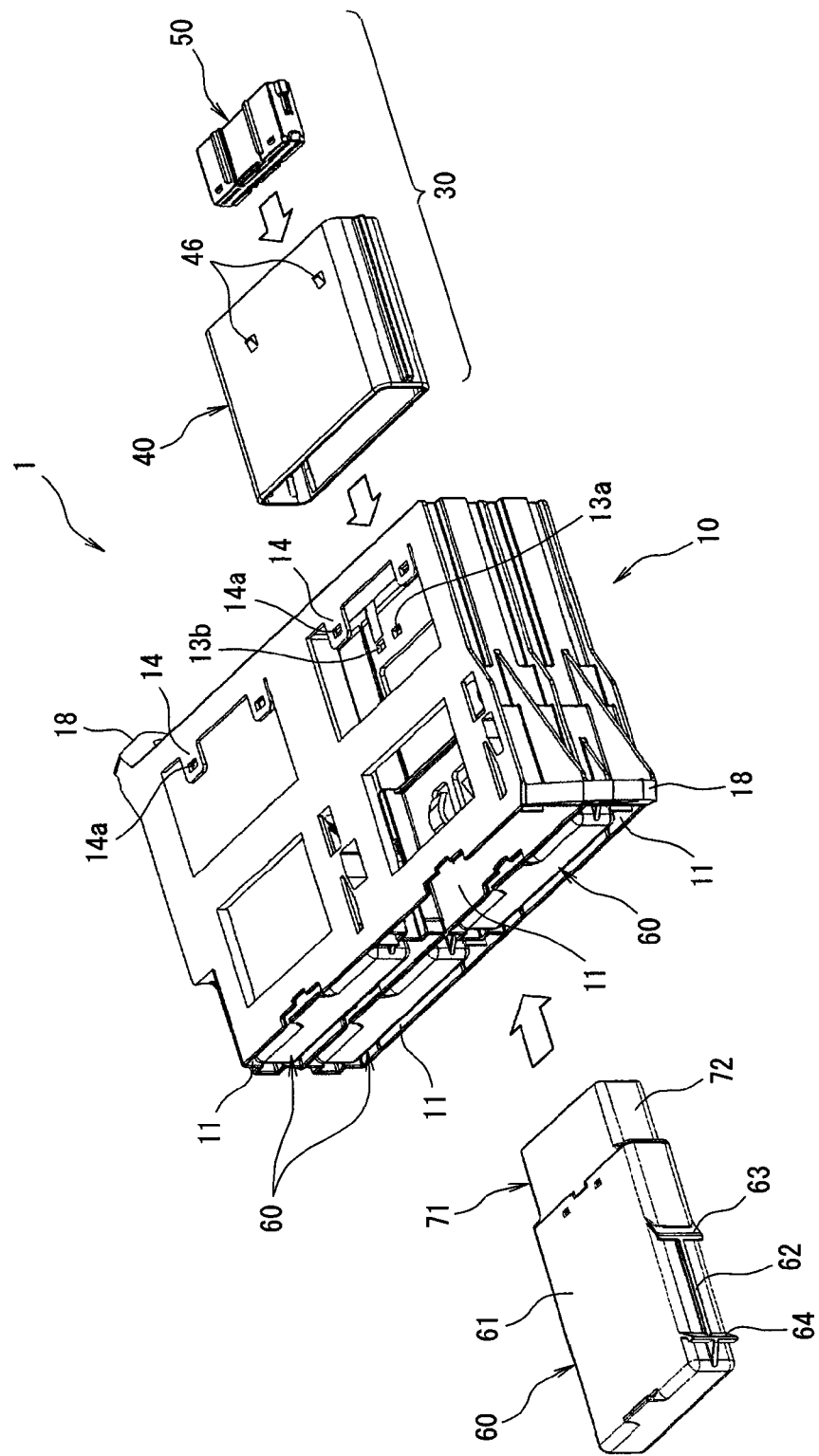
FIG. 2 is a perspective view showing a circuit unit accommodation box, with the box body, one of the receptacles, and one of the circuit units that make up the circuit unit accommodation box being disassembled.

Next, an embodiment of the present invention will be described with reference to the figures. FIG. 1 is a perspective view showing a state in which circuit units are accommodated in a circuit unit accommodation box of the present invention. FIG. 2 is a perspective view showing a circuit unit accommodation box, with the box body, one of the receptacles, and one of the circuit units that make up this circuit unit accommodation box being disassembled.

In FIGS. 1 and 2, the circuit unit accommodation box 1 is constructed so as to accommodate a plurality of circuit units 60 (four circuit units in the embodiment shown), and having a box body 10 and receptacles 30.

Figure 3:
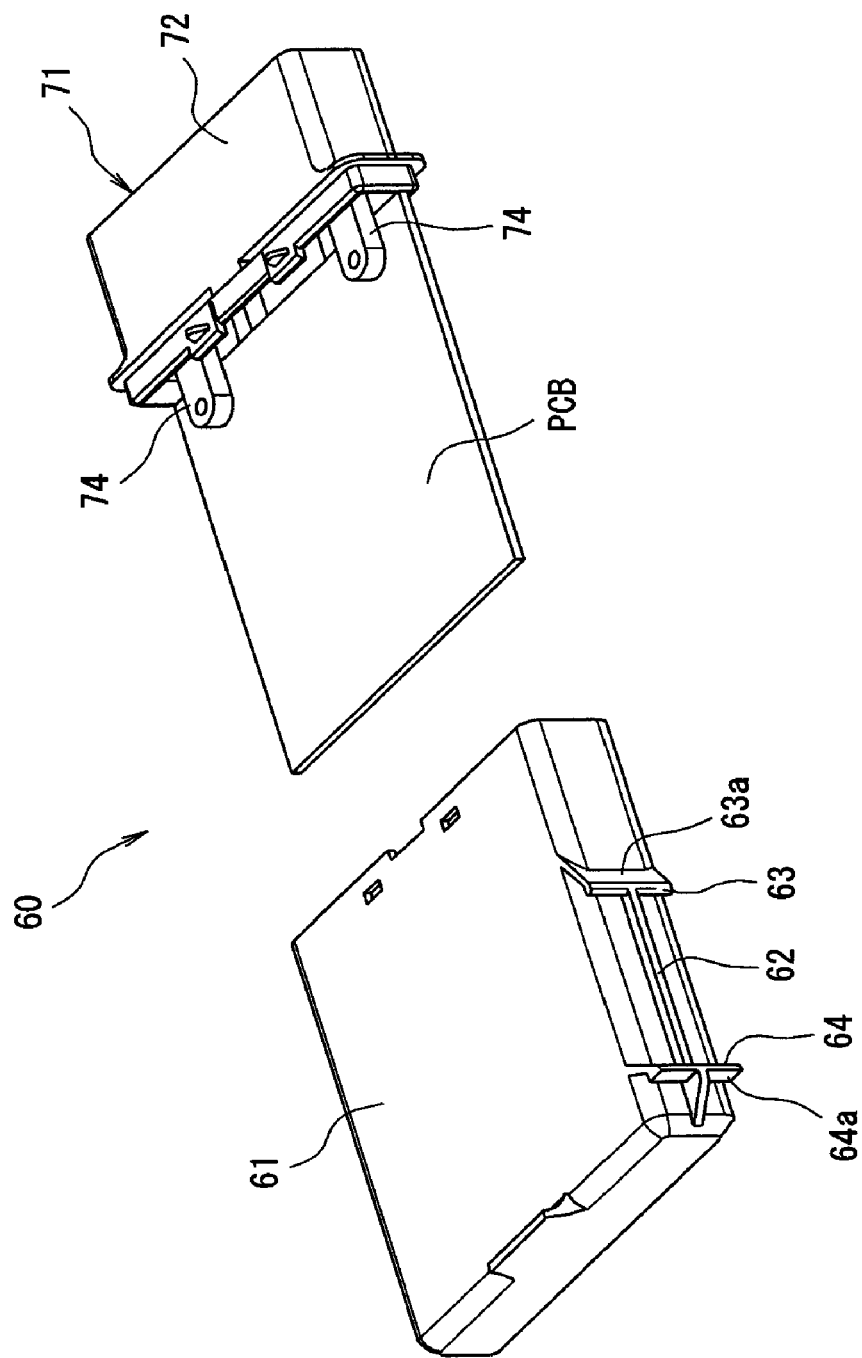
FIG. 3 is an exploded perspective view of a circuit unit.

FIG. 3 is an exploded perspective view of a circuit unit. FIGS. 4A through 4D show the circuit unit of FIG. 3; FIG. 4A is a plan view, FIG. 4B is a front view, FIG. 4C is a left side view, and FIG. 4D is a sectional view along line 4D-4D in FIG. 4C.

Figure 4:
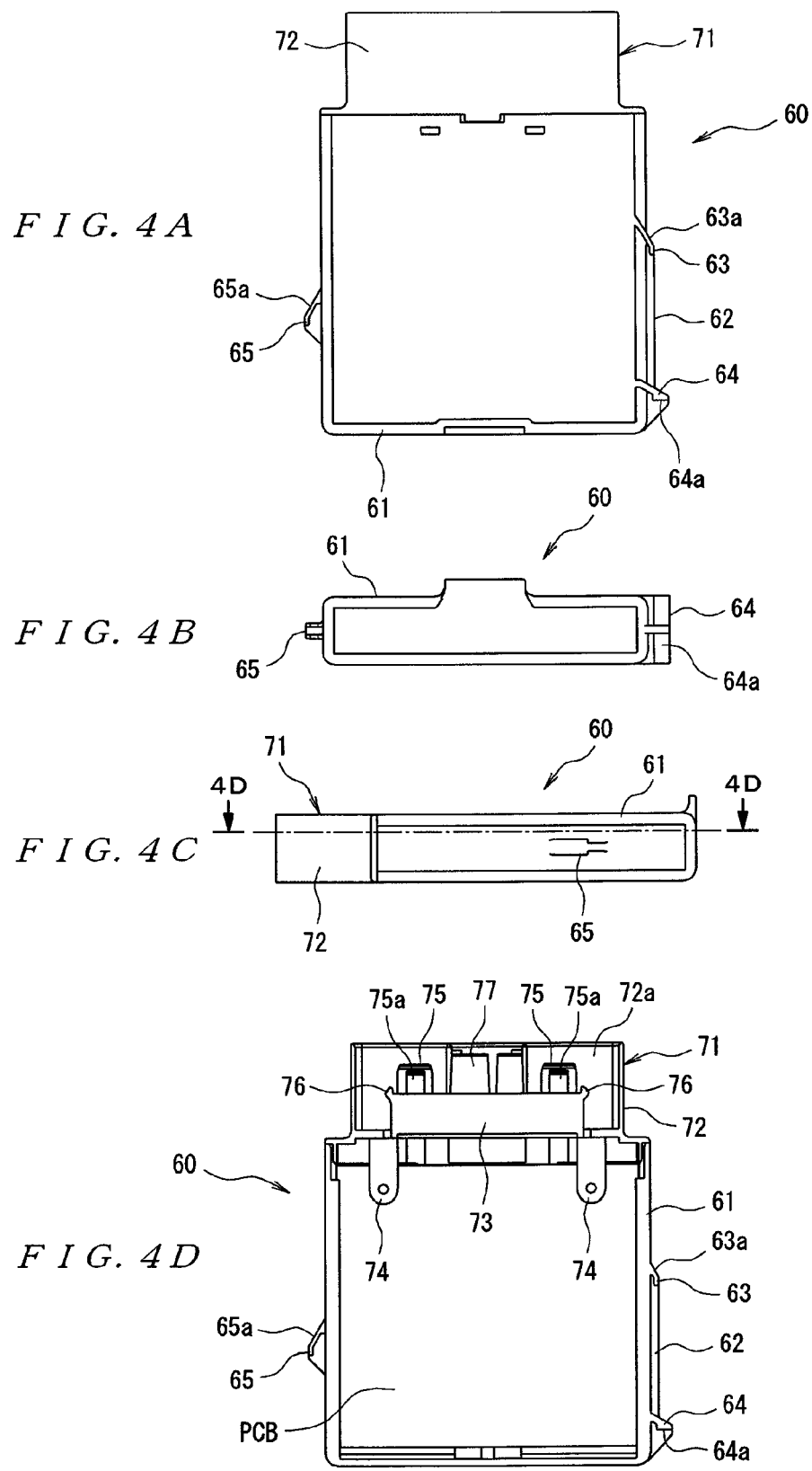
FIGS. 4A through 4D show the circuit unit of FIG. 3, with FIG. 4A being a plan view, FIG. 4B being a front view, FIG. 4C being a left side view, and FIG. 4D being a sectional view along line 4D-4D, shown in FIG. 4C.

As is shown in FIGS. 2 through 4D, each circuit unit 60 includes a substantially flattened square cylindrical housing 61 and a first connector 71 fastened to the front end (right end in FIG. 2) of the housing 61. The first connector 71 has a substantially flattened square cylindrical housing 72 fastened to the front end of the housing 61. As is shown in FIG. 4D, a recess 72a that opens to the front surface and that receives the connector accommodating recess 41 of a receptacle 30 is formed in the interior of the housing 72. Furthermore, as is shown in FIG. 4D, a substantially rectangular contact fastener 73, that extends in the direction of width of the housing 72, is provided inside the recess 72a so as to protrude forward from the bottom of the recess 72a. A plurality of rows of contacts (not shown in the figures) is attached to this contact fastener 73. Moreover, a pair of fasteners 74, for fastening the housing 72 to the surface of a circuit board PCB, are provided on the rear portion of the housing 72. The aforementioned respective contacts are configured such that the rear end portions thereof are connected to the circuit board PCB by soldering. In addition, pairs of locks 75 are respectively provided on two surfaces of the contact fastener 73 (one pair on the upper surface and the other pair on the lower surface) such that the locks 75 protrude forward from the contact fastener 73. An opening 75a is formed in each of the locks 75. Furthermore, pairs of first unlocking projections 76 are respectively provided on either side surface, in the direction of width of the contact fastener 73, at two ends thereof (one pair at the upper end and the other pair at the lower end). Moreover, an erroneous mating prevention plate 77 extends forward from substantially the central portion, in the direction of width of the front surface of the contact fastener 73, and slightly toward the upper side in the vertical direction.

As is shown in FIGS. 2 through 4D, each circuit unit 60 includes a substantially flattened square cylindrical housing 61 and a first connector 71 fastened to the front end (right end in FIG. 2) of the housing 61. The first connector 71 has a substantially flattened square cylindrical housing 72 fastened to the front end of the housing 61. As is shown in FIG. 4D, a recess 72a that opens to the front surface and that receives the receptacle 30 is formed in the interior of the housing 72. Furthermore, as is shown in FIG. 4D, a substantially rectangular contact fastener 73, that extends in the direction of width of the housing 72, is provided inside the recess 72a so as to protrude forward from the bottom of the recess 72a. A plurality of rows of contacts (not shown in the figures) is attached to this contact fastener 73. Moreover, a pair of fasteners 74, for fastening the housing 72 to the surface of a circuit board PCB, are provided on the rear portion of the housing 72. The aforementioned respective contacts are configured such that the rear end portions thereof are connected to the circuit board PCB by soldering. In addition, pairs of locks 75 are respectively provided on two surfaces of the contact fastener 73 (one pair on the upper surface and the other pair on the lower surface) such that the locks 75 protrude forward from the contact fastener 73. An opening 75a is formed in each of the locks 75. Furthermore, pairs of first unlocking projections 76 are respectively provided on either side surface, in the direction of width of the contact fastener 73, at two ends thereof (one pair at the upper end and the other pair at the lower end). Moreover, an erroneous mating prevention plate 77 extends forward from substantially the central portion, in the direction of width of the front surface of the contact fastener 73, and slightly toward the upper side in the vertical direction.

Figure 5:
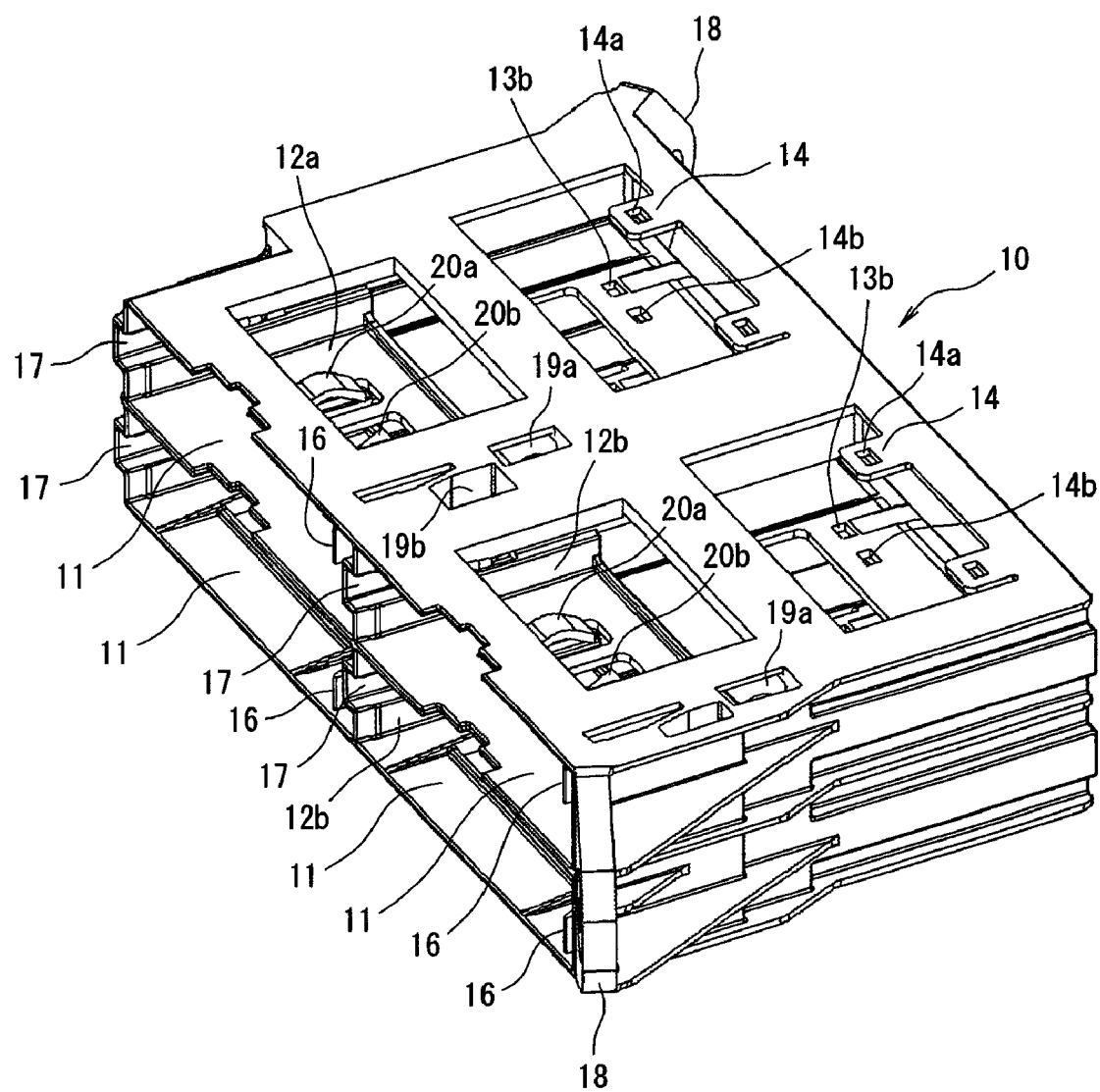
FIG. 5 is a perspective view of the box body as seen from the front side.
Figure 6:
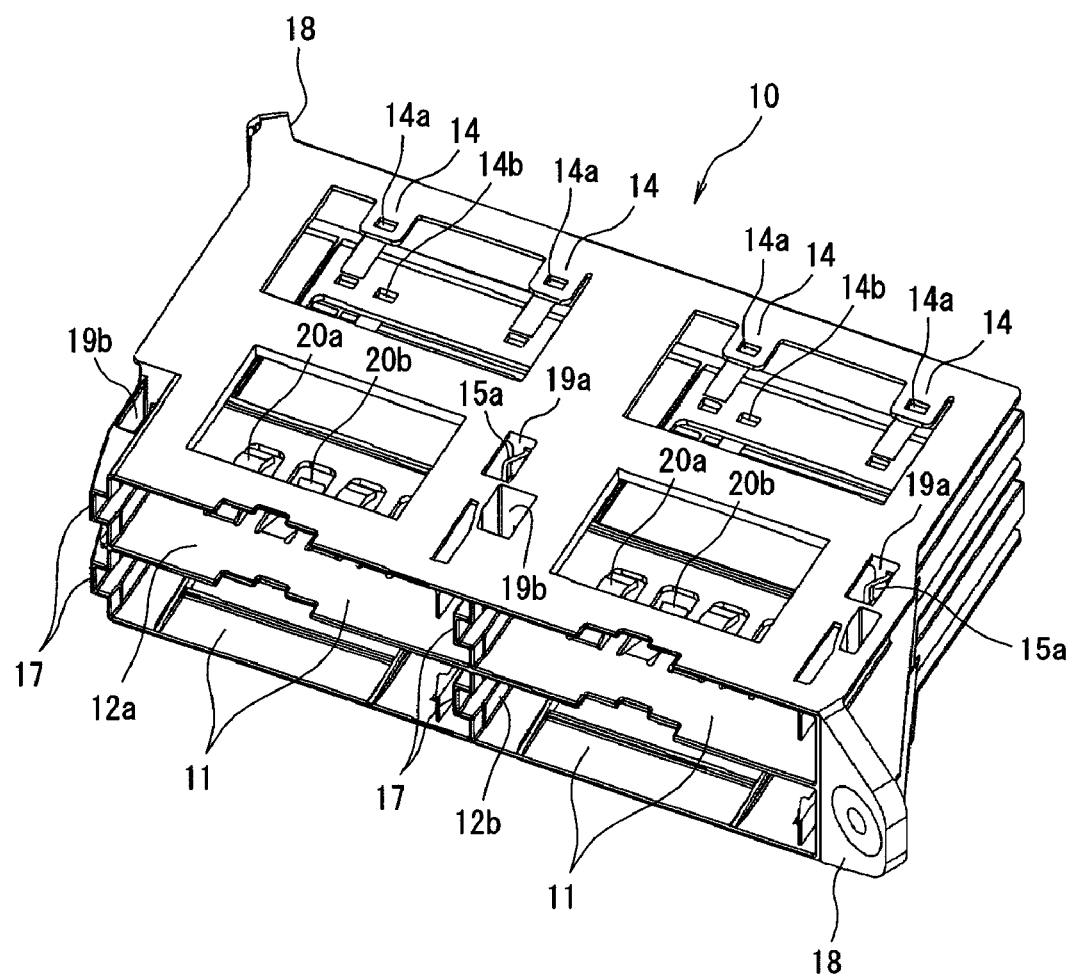
FIG. 6 is a perspective view of the box body as seen with the viewing angle slightly varied from FIG. 5.
Figure 7:
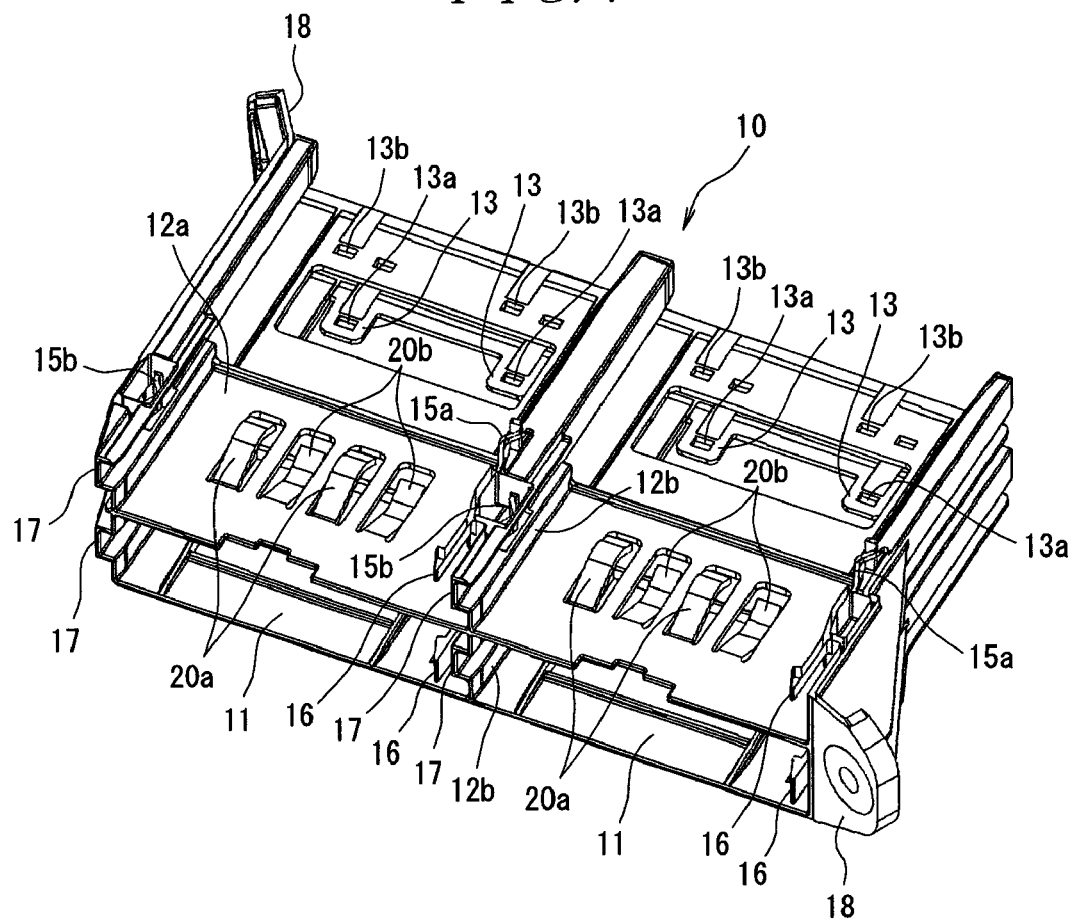
FIG. 7 is a perspective view showing a state in which the upper wall is removed from the box body shown in FIG. 6.
Figure 9A:
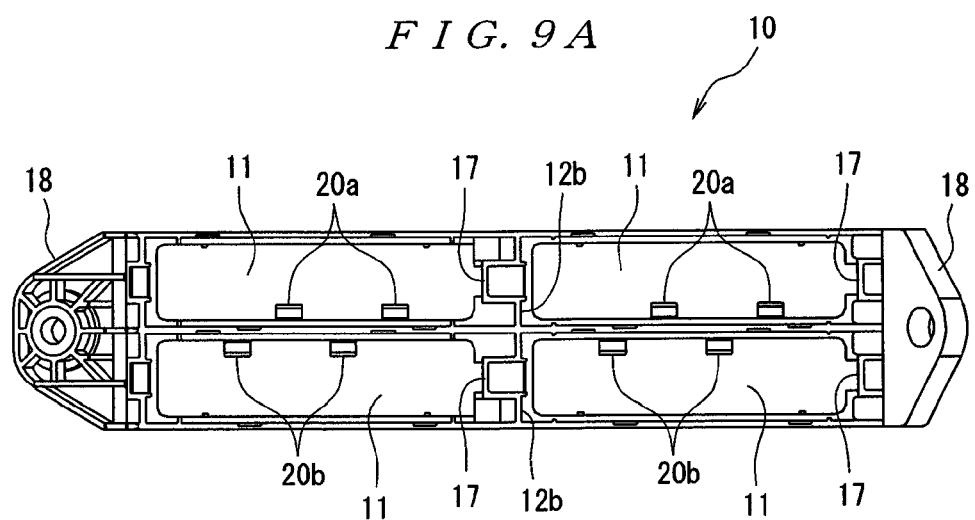
FIGS. 9A and 9B show the box body, with FIG. 9A being a back view, and FIG. 9B being a left side view.
Figure 9B:
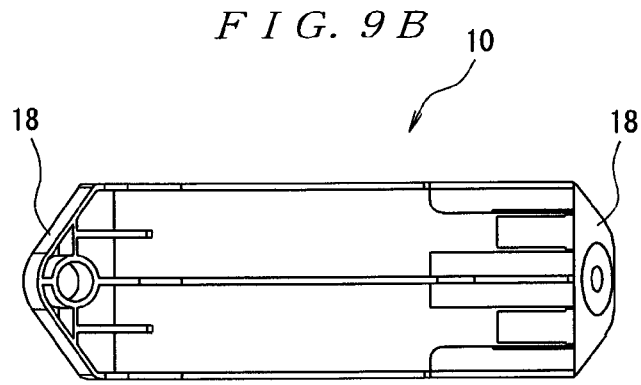
Figure 10:
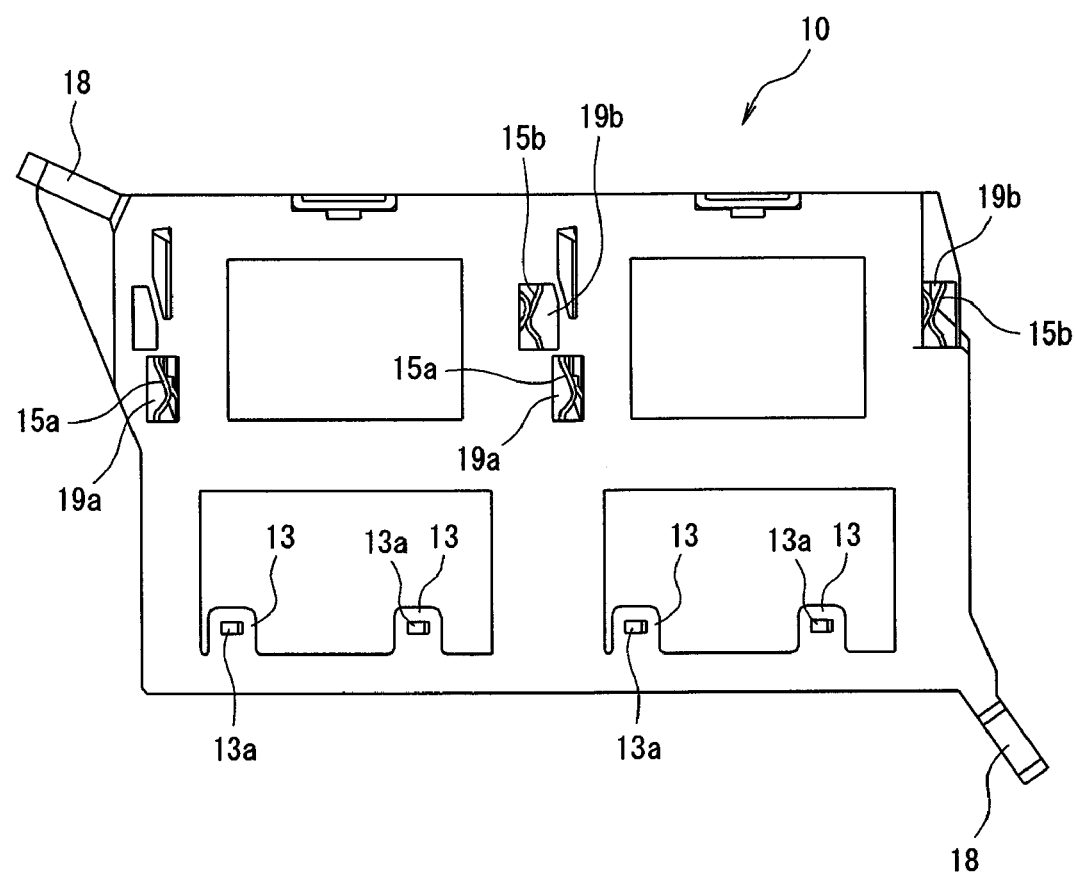
FIG. 10 is a bottom view of the box body.

FIG. 5 is a perspective view of the box body as seen from the front side. FIG. 6 is a perspective view of the box body as seen with the viewing angle slightly varied from FIG. 5. FIG. 7 is a perspective view showing a state in which the upper wall is removed from the box body shown in FIG. 6. FIGS. 8A and 8B show the box body; FIG. 8A is a plan view, and FIG. 8B is a front view. FIGS. 9A and 9B show the box body; FIG. 9A is a back view, and FIG. 9B is a left side view. FIG. 10 is a bottom view of the box body.

As is shown in FIGS. 2 and 5 through 10, the box body 10 is formed in a substantially rectangular parallelepiped shape, and has a plurality of circuit unit accommodating recesses 11 (four accommodating parts in the present embodiment) into which the circuit units 60 are inserted. The circuit unit accommodating recesses 11 are provided such that there are two on the upper side and two on the lower side, with an upper-lower partition wall 12a in between. Furthermore, the two upper circuit unit accommodating recesses 11 and the two lower circuit unit accommodating recesses 11 are respectively divided into left and right, with partition walls 12b in between. The respective circuit unit accommodating recesses 11 pass through the box body 10 in the front-back direction (with the left side in FIG. 2 being referred to as the front side, and the right side being referred to as the rear side). Moreover, as is shown in FIG. 7, a pair of locking tongues 13, which extend forward from the bottom wall of the box body 10, are provided in the rear portion of each of the two lower circuit unit accommodating recesses 11, and a first opening 13a is formed in each of the locking tongues 13. In addition, second openings 13b are formed in the upper-lower partition wall 12a of the box body 10 in positions corresponding to the first openings 13a in the vertical direction. Locking projections 46, which are formed on the upper wall of the cover 40 of the corresponding receptacle 30 (described later) respectively, enter the first openings 13a. Locking projections that are formed on the lower wall of the cover 40 respectively enter the second openings 13b. Therefore, the cover 40 of the receptacle 30 is locked with the box body 10. Meanwhile, as is shown in FIG. 6, a pair of locking tongues 14, which extend forward from the top wall of the box body 10, are provided in the rear portion of each of the two upper circuit unit accommodating recesses 11. A third opening 14a is formed in each of these locking tongues 14. Furthermore, fourth openings 14b are formed in the upper-lower partition wall 12a of the box body 10 in positions corresponding to the third openings 14a in the vertical direction. Locking projections 46, formed on the upper wall of the cover 40 of the corresponding receptacle 30 respectively, enter the third openings 14a, and locking projections formed on the lower wall of the cover 40 respectively enter the fourth openings 14b. Therefore, the cover 40 of the receptacle 30 is locked with the box body 10.

Moreover, a first spring 15a is provided on the right side wall (right side wall in FIG. 8A) of each of the circuit unit accommodating recesses 11, with this first spring 15a driving the corresponding circuit unit 60 forward (downward in FIG. 18) and leftward (leftward in FIG. 18), resulting from the inclined surface 63a of the first rib 63 of the circuit unit 60 engaging with this first spring 15a when the circuit unit 60 is inserted into the second position shown in FIG. 18 (described later). In addition, a second spring 15b is provided on the left side wall of each of the circuit unit accommodating recesses 11 of the box body 10, with this second spring 15b driving the corresponding circuit unit 60 forward and rightward, resulting from the inclined surface 65a of the third rib 65 of the circuit unit 60 engaging with this second spring 15b when the circuit unit 60 is inserted into the second position. Furthermore, a lock 16 is provided on the right side wall of each of the circuit unit accommodating recesses 11 of the box body 10. The lock 16 restricts the forward movement of the corresponding circuit unit 60 by locking the perpendicular surface 64a of the second rib 64 of the circuit unit 60 when the circuit unit 60 is inserted into the second position. The first spring 15a, second spring 15b, and lock 16 and the first ribs 63, third ribs 65, and second ribs 64, provide a securing mechanism in order to secure the circuit units 60 in the box body 10. The securing mechanism is provided when the circuit units 60 are inserted into the second position. Moreover, as is shown in FIG. 8A, first windows 19a, which allow the viewing of the corresponding first spring 15a and therefore allow the viewing of the state of engagement of these first spring 15a with the first ribs 63 of the corresponding circuit units 60, are formed in the upper wall of the box body 10. Likewise, as is shown in FIG. 8A, second windows 19b, which allow the viewing of the corresponding second spring 15b and therefore allow the viewing of the state of engagement of these second spring 15b with the third ribs 65 of the corresponding circuit units 60, are formed in the upper wall of the box body 10. Meanwhile, as is shown in FIG. 10, first windows 19a, which allow the viewing of the state of engagement of the corresponding first spring 15a with the first ribs 63 of the corresponding circuit units 60, are formed in the lower wall of the box body 10 as well. Likewise, second windows 19b, which allow the viewing of the state of engagement of the corresponding second spring 15b with the third ribs 65 of the corresponding circuit units 60, are formed in the lower wall of the box body 10 as well.

Furthermore, a reverse insertion preventing groove 17 that extends in the front-back direction is formed in the left side wall of each of the circuit unit accommodating recesses 11 of the box body 10. In the insertion of the circuit units 60 into the respective circuit unit accommodating recesses 11, when the circuit units 60 are inserted properly, the third ribs 65 provided on the circuit units 60 are respectively guided inside the reverse insertion preventing groove 17. On the other hand, if the circuit units 60 are inserted into the respective circuit unit accommodating recesses 11 upside down, the third ribs 65 interfere with the right side walls of the respective circuit unit accommodating recesses 11, so that the insertion is prevented. Moreover, the upper-lower partition wall 12a of the box body 10 is provided with a plurality of first springs 20a that eliminate wobbling of the circuit units 60 inserted into the lower circuit unit accommodating recesses 11 by driving these circuit units 60 in the upward direction and a plurality of second springs 20b that eliminate wobbling of the circuit units 60 inserted into the lower circuit unit accommodating parts 11 by driving these circuit units 60 in the downward direction. In addition, attachments 18 for a vehicle body (not shown in the figures) are respectively provided at the front end of the right side wall and at the rear end of the left side wall of the box body 10. Note that FIG. 4C shows a circuit unit with the third rib 65, thereof, being positioned at the center height of this circuit unit 60 in the vertical direction. FIG. 8B shows the circuit unit accommodating recesses 11 with the reverse insertion preventing grooves 17, thereof, being positioned at the center height of the corresponding circuit unit accommodating recesses 11 in the vertical direction. It would also be possible to provide the third ribs 65 at mutually different height positions by varying the heights of the third ribs 65 of the circuit units 60 being inserted into the respective circuit unit accommodating recesses 1. Additionally, it would also be possible to provide the reverse insertion preventing grooves 17 at mutually different height positions among the circuit unit accommodating recesses 11 corresponding to the height positions of the third ribs 65. In doing so, specific circuit units 60 can be inserted into specific circuit unit accommodating recesses 11, so that erroneous attachment of the circuit units 60 can be prevented.

Figure 11:
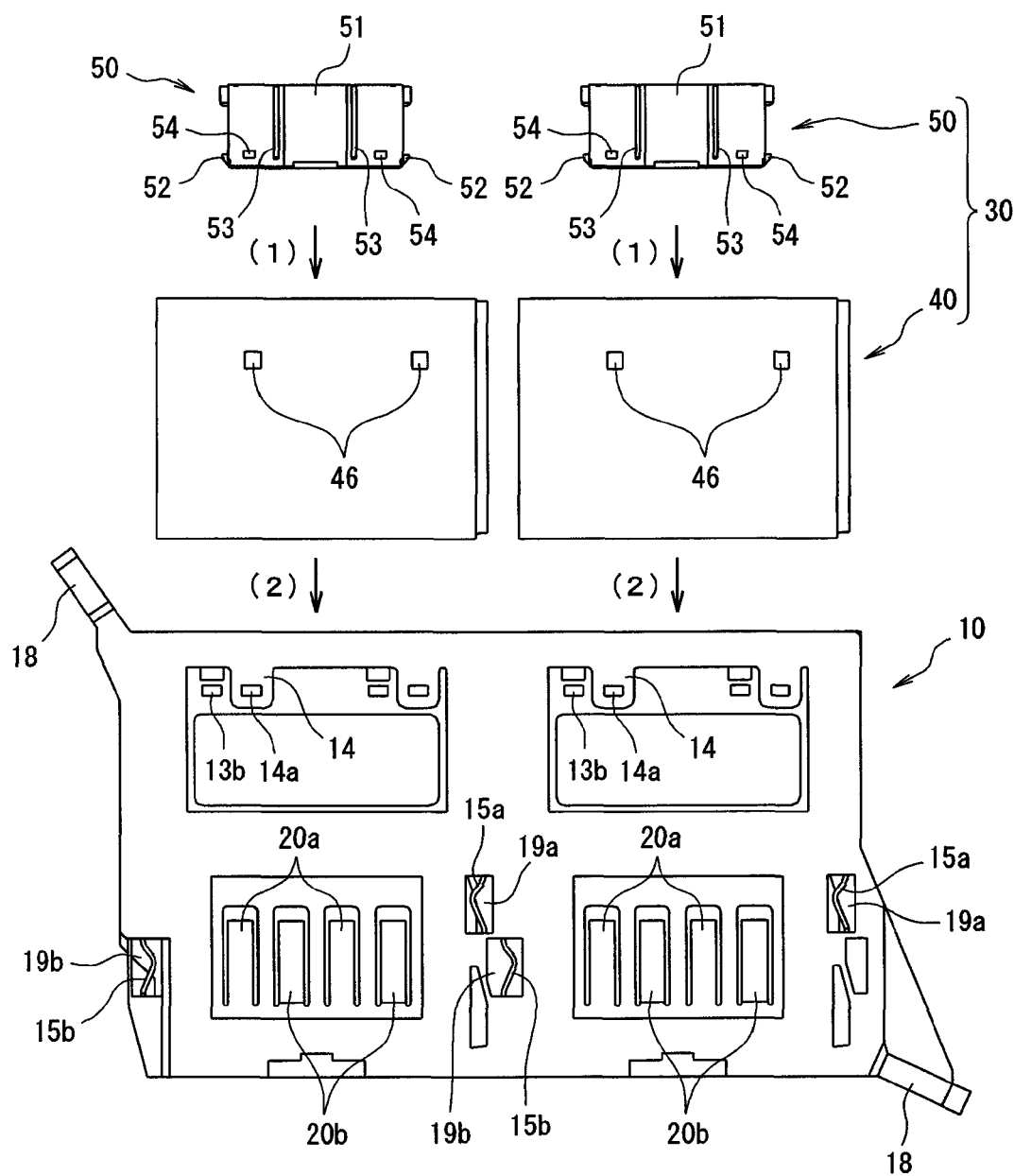
FIG. 11 is a plan view for illustrating the procedure for attaching receptacles to the box body.
Figure 12:
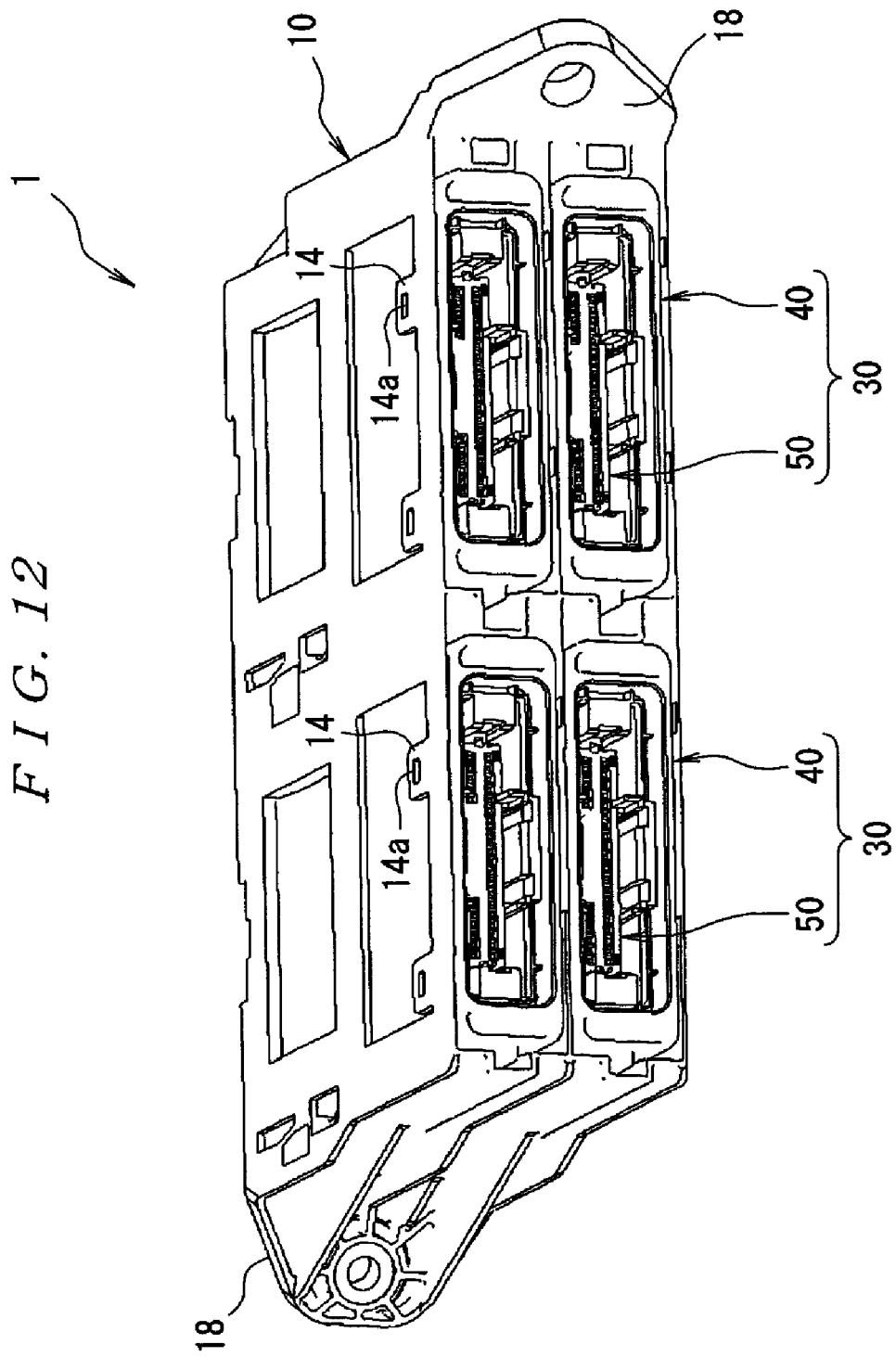
FIG. 12 is a perspective view as seen from the back side of the circuit unit accommodation box in which the receptacles have been attached to the box body.
Figure 13:
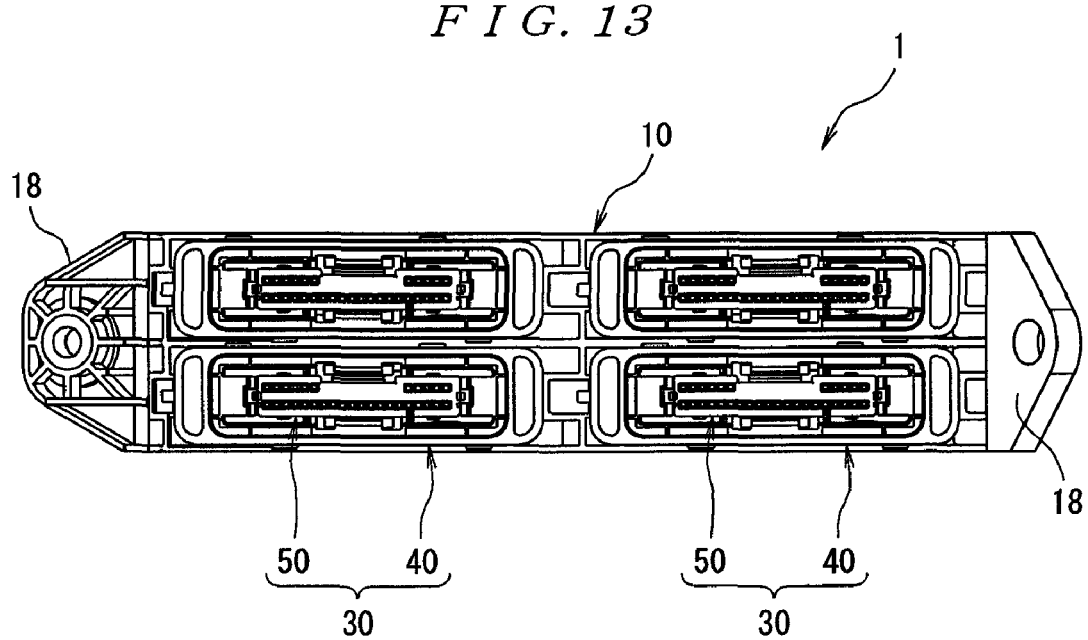
FIG. 13 is a back view of the circuit unit accommodation box in which the receptacles have been attached to the box body.
Figure 14:
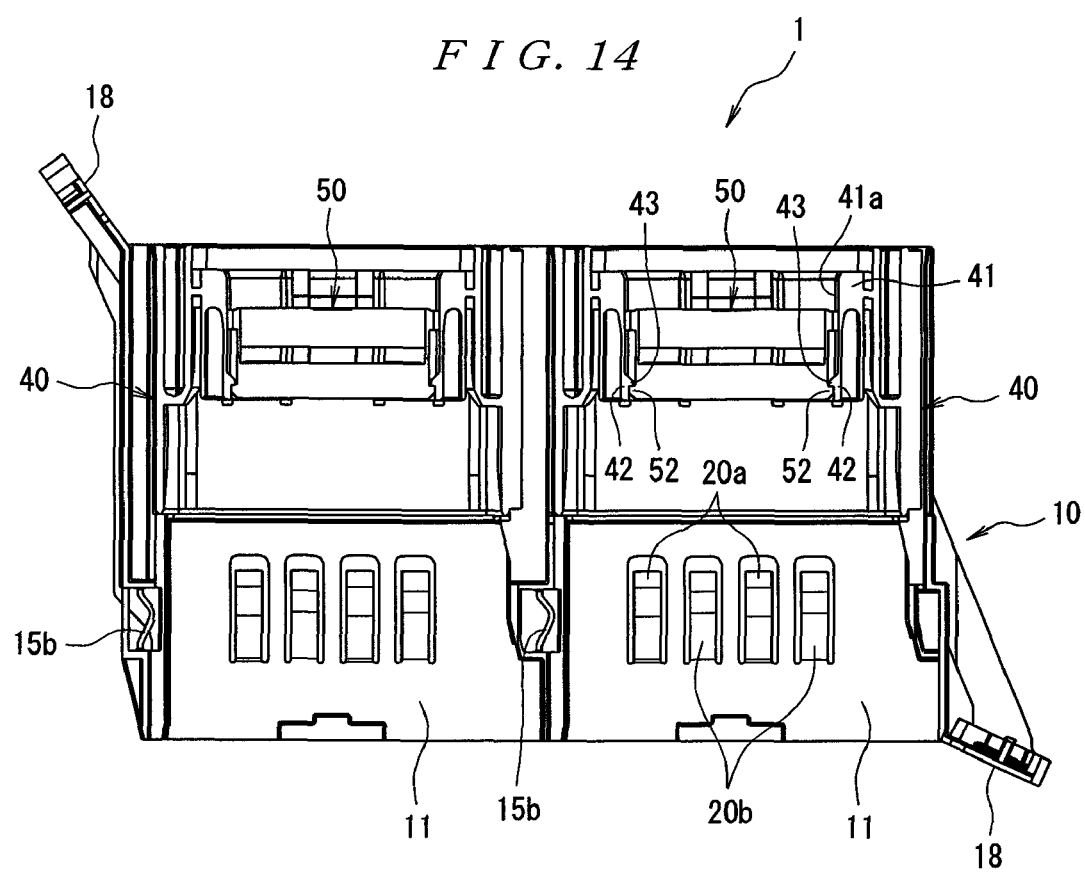
FIG. 14 is a sectional view of the circuit unit accommodation box in which the receptacles have been attached to the box body.
Figure 15:
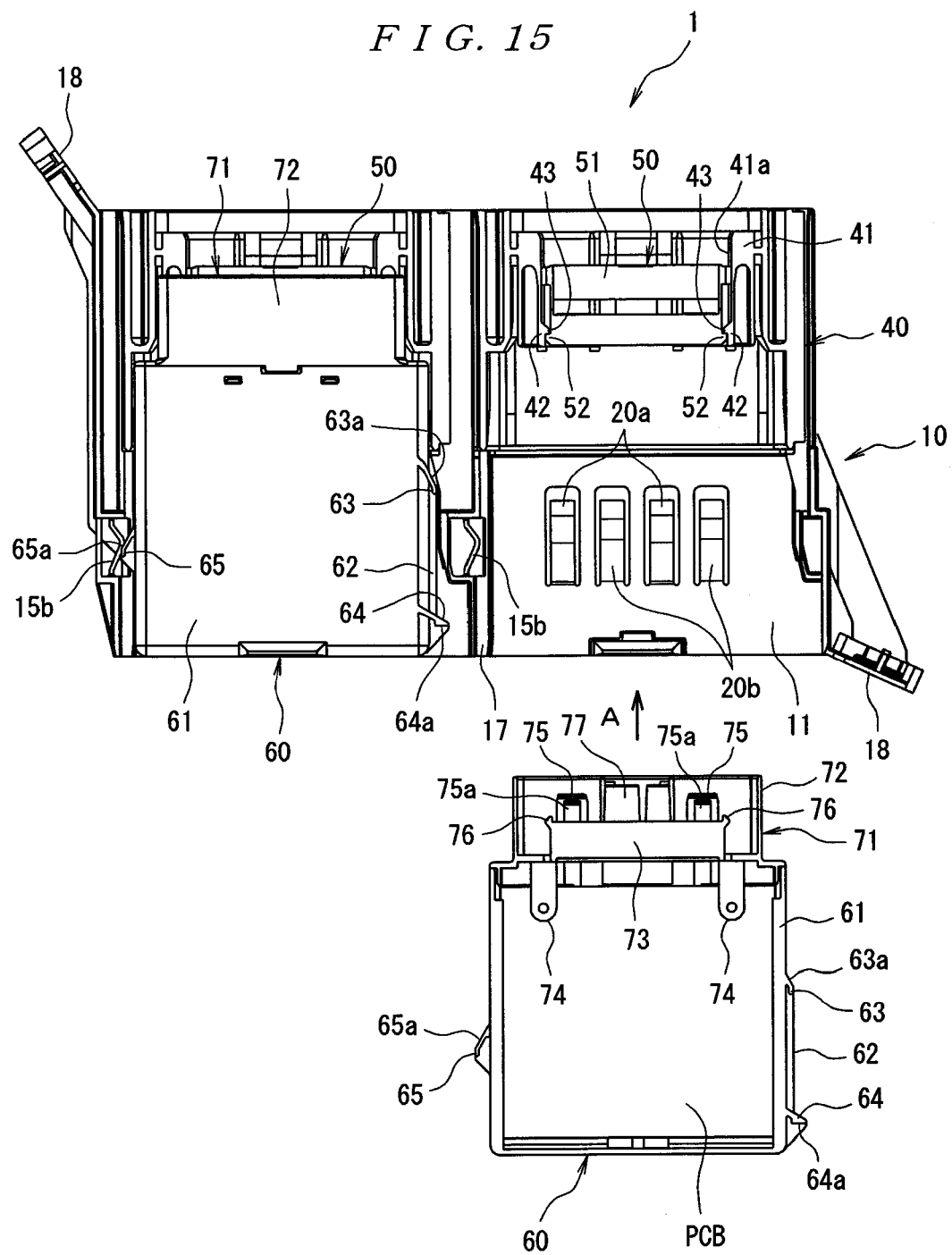
FIG. 15 is a sectional view showing a state prior to the insertion of the circuit units into the circuit unit accommodation box; in this FIG. 15, however, a circuit unit has been inserted into the left-side circuit unit accommodating recess out of the upper circuit unit accommodating recesses.
Figure 16:
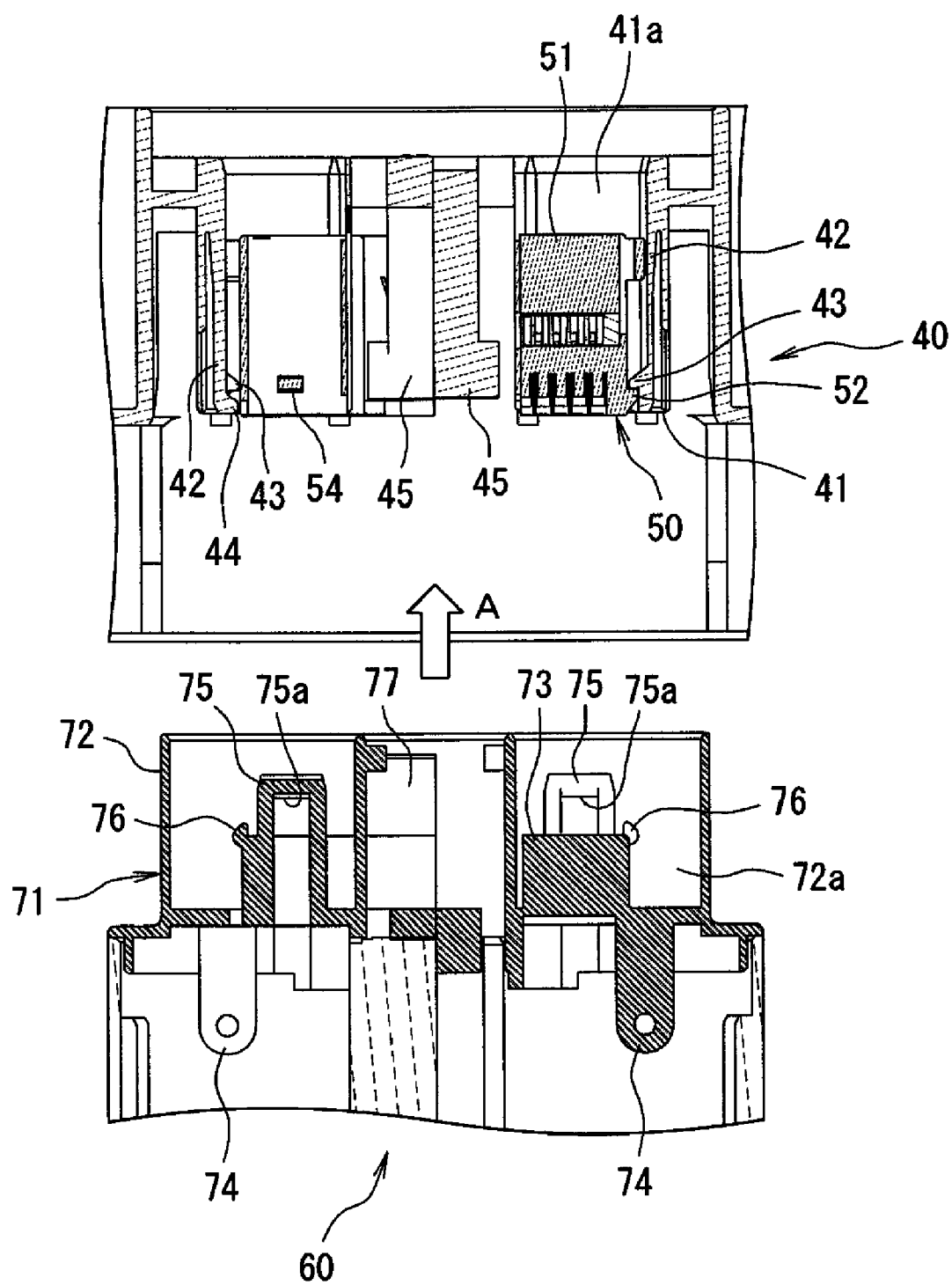
FIG. 16 is a sectional view of essential parts showing a state prior to the insertion of the circuit units into the circuit unit accommodation box, with the position of the cross section being varied from FIG. 15.
Figure 17:
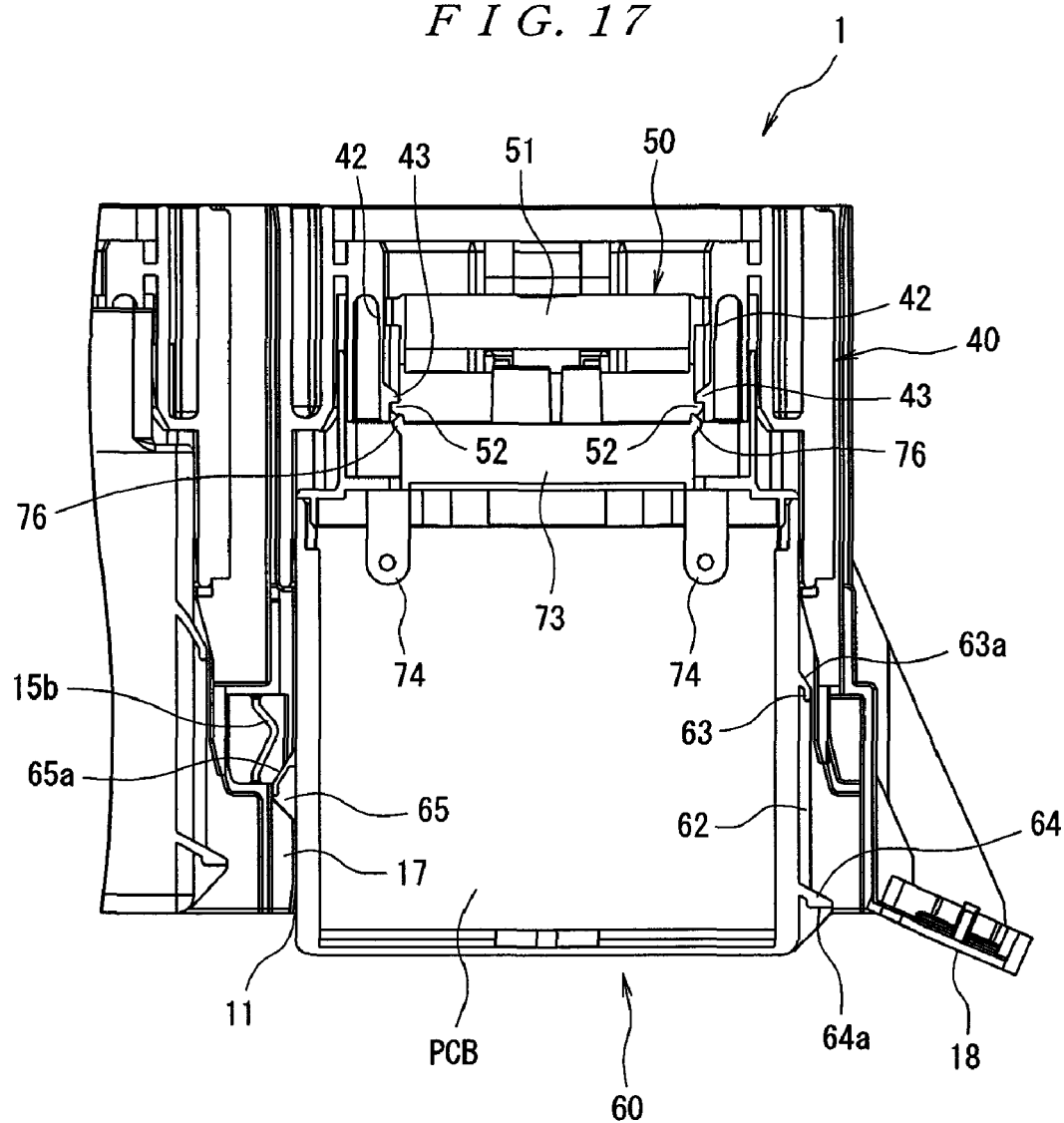
FIG. 17 is a sectional view showing a state in which a circuit unit has been inserted into the first position, and the first connector of the circuit unit has mated with the corresponding second connector.

Next, FIG. 11 is a plan view for illustrating the procedure for attaching receptacles to the box body. FIG. 12 is a perspective view as seen from the back side of the circuit unit accommodation box in which the receptacles have been attached to the box body. FIG. 13 is a back view of the circuit unit accommodation box in which the receptacles have been attached to the box body. FIG. 14 is a sectional view of the circuit unit accommodation box in which the receptacles have been attached to the box body. FIG. 15 is a sectional view showing a state prior to the insertion of the circuit units into the circuit unit accommodation box. However, in FIG. 15, a circuit unit has been inserted into the left-side circuit unit accommodating recess 11 out of the lower circuit unit accommodating recesses 11. FIG. 16 is a sectional view of essential parts, showing a state prior to the insertion of the circuit units into the circuit unit accommodation box, with the position of the cross section being varied from FIG. 15. FIG. 17 is a sectional view showing a state in which a circuit unit has been inserted into the first position, and the first connector of the circuit unit has mated with the corresponding second connector. FIG. 18 is a sectional view showing a state in which the circuit unit has been inserted into the second position, and the accommodation of the circuit unit in the circuit unit accommodation box has been completed.

The receptacles 30, shown in FIGS. 11 through 14, each include a cover 40 that receives the corresponding circuit unit 60 having a first connector 71. The cover 40 guides this circuit unit 60 to a specified position. The receptacles 30 also include a second connector 50 that is accommodated inside the cover 40 and that mates with the first connector 71. Here, the "specified position" is a position into which the circuit unit 60 is ultimately inserted (equivalent to the second position) and a position from which the circuit unit 60 cannot be inserted any further.

The cover 40 has a substantially flattened square cylindrical shape, and is designed to receive the housing 61 of the corresponding circuit unit 60 in the front portion (lower portion in FIG. 11) and to receive the housing 72 of the first connector 71 in the rear portion. Moreover, as is shown in FIGS. 14 and 16, a connector accommodating recess 41 that accommodates the second connector 50 is formed in the rear portion of the cover 40. A through-hole 41a that extends through the accommodating recess 41 in the front-back direction and that accommodates the second connector 50 is formed in the interior of the connector accommodating recess 41. Furthermore, a pair of latch arms 42 is provided with one latch arm being provided on either side wall of the connector accommodating recess 41 in the direction of width. The respective latch arms 42 are formed in a cantilever shape that extends forward from the rear portion of either side wall of the connector accommodating recess 41 in the direction of width such that the vicinity of the tip ends of these latch arms 42 protrude into the through-hole 41a. Moreover, first projections 43 for locking the second connector 50 inside the connector accommodating recess 41 are respectively formed at the tip ends of these latch arms 42 in the central portions in the vertical direction such that these first projections 43 protrude into the through-hole 41a, and pairs of second release projections 44 for unlocking the second connector 50 from the first projections 43 are respectively formed at the tip ends of the latch arms 42 at two ends in the vertical direction (one pair at the upper end and the other pair at the lower end) such that these second release projections 44 protrude into the through-hole 41a. In addition, a pair of cantilever supporting arms 45 that extend from the vicinity of the rear end portion of the connector accommodating recess 41 to the vicinity of the front end portion is provided with one supporting arm being provided on the upper wall and the other supporting arm being provided on the lower wall of the cover 40. Furthermore, as is shown in FIG. 11, locking projections 46 for locking the cover 40 in the box body 10 by entering the corresponding first openings 13a or third openings 14a of the box body 10 are provided on the upper wall of the cover 40. Likewise, locking projections (not shown in the figures) for locking the cover 40 in the box body 10 by entering the corresponding second openings 13b or fourth openings 14b of the box body 10 are provided on the lower wall of the cover 40.

Moreover, each second connector 50 includes a substantially rectangular housing 51 and contacts (not shown in the figures) that are attached to the housing 51 in a plurality of rows and that make contact with the contacts of the corresponding first connector 71 in the front portions thereof. The respective contacts of the second connector 50 are connected to electrical wires (not shown in the figures) in the rear portions thereof. As is shown in FIGS. 14 and 16, a pair of second projections 52 that are locked with the first projections 43 provided on the connector accommodating recess 41 are formed with one second projection 52 being formed on either end surface in the direction of width of the housing 51 of the second connector 50. Furthermore, pairs of projecting ribs 53 (see FIG. 11) that extend in the front-back direction are respectively formed so as to protrude from two surfaces (one pair from the upper surface and the other pair from the lower surface) of the housing 51 of the second connector 50. Moreover, pairs of locking projections 54, that respectively enter the openings 75a of the locks 75 of the corresponding first connector 71 and lock the first connector 71 and second connector 50, are formed so as to protrude from the vicinity of the front end portions of two surfaces (one pair from the upper surface and the other pair from the lower surface) of the housing 51 of the second connector 50. In addition, an erroneous mating prevention hole (not shown in the figures), into which the erroneous mating prevention plate 77 (provided on the first connector 71) is fitted, is bored substantially in the central portion in the direction of width of the front surface of the housing 51 of the second connector 50, and slightly toward the upper side in the vertical direction.

Next, the procedure for attaching the receptacles 30 to the box body 10 will be described. First, each of the second connectors 50 attached to the end of a wire harness (electrical wires) is received in the through-hole 41a of the connector accommodating recess 41 of the cover 40 from the rear side of the cover 40 as indicated by arrow (1) in FIG. 11. Consequently, the second projections 52 of the second connector 50 respectively ride over the first projections 43, and are positioned forward from these first projections 43, so that rearward movement is restricted. When the second projections 52 ride over the first projections 43 in this manner, the front end surface of the housing 51 of the second connector 50 is located in a position that substantially coincides with the front end surface of the connector accommodating recess 41 of the corresponding cover 40 (see FIG. 14). Then, the front end surfaces of the pairs of projecting ribs 53, which are provided on two surfaces (one pair on the upper surface and the other pair on the lower surface) of the housing 51 of the second connector 50, contact the rear end surfaces of stopper projections (not shown in the figures) that are provided on the connector accommodating recess 41. Therefore, forward movement of the second connector 50 is restricted, and as a result, a receptacle 30 is completed.

Furthermore, the plurality of receptacles 30 (four connectors in the present embodiment) are respectively accommodated inside the circuit unit accommodating recesses 11 from the rear side of the box body 10, as indicated by arrow (2) in FIG. 11. Consequently, with regard to the receptacles 30, the locking projections 46, formed on the upper walls of the covers 40 respectively, enter the third openings 14a of the locking tongues 14 of the box body 10. The locking projections formed on the lower walls of the covers 40 respectively enter the fourth openings 14b of the locking tongues 14 of the box body 10, so that the receptacles 30 are fastened to the box body 10. Likewise, with regard to the receptacles 30, the locking projections 46 enter the first openings 13a of the locking tongues 13 of the box body 10, and the locking projections enter the second openings 13b of the locking tongues 13, so that the receptacles 30 are fastened to the box body 10. As a result, the circuit unit accommodation box 1 is completed as shown in FIGS. 12 through 14.

Next, a method for accommodating the circuit units 60 in the circuit unit accommodation box 1 will be described with reference to FIGS. 15 through 18.

First, as shown in FIG. 15, in which the individual circuit units 60 are not accommodated in the circuit unit accommodation box 1, the respective circuit units 60 are caused to advance from the front side of the box body 10 in the direction indicated by arrow A in FIGS. 15 and 16 (opposite direction from the direction of attachment of the second connectors 50 inside the covers 40). Then, the circuit units 60 are respectively inserted into the circuit unit accommodating recesses 11 of the box body 10 to the first position shown in FIG. 17. In this case, if the circuit units 60 are inserted in the proper vertical direction, the third ribs 65, provided on the circuit units 60, are respectively guided inside the reverse insertion preventing grooves 17. In contrast, if the circuit units 60 are inserted into the respective circuit unit accommodating recesses 11 upside down, then the third ribs 65 interface with the right side walls of the respective circuit unit accommodating recesses 11, so that the erroneous insertion is prevented.

When the circuit units 60 are inserted into the circuit unit accommodating recesses 11 to the first position shown in FIG. 17, the first connectors 71 respectively mate with the second connectors 50, so that the contacts of the first connectors 71 and the contacts of the second connectors 50 make electrical contact with each other. In this state, furthermore, the locks 75 of the first connectors 71 respectively ride over the locking projections 54 of the second connectors 50, and the locking projections 54 respectively enter the openings 75a, thus completing the locking of the first connectors 71 and the second connectors 50. Note, the first unlocking projections 76 contact the second release projections 44 provided on the latch arms 42 of the covers 40.

Then, when the respective circuit units 60 advance further, a state is created in which the circuit units 60 are inserted from the first position to a position that is further toward the interior. In this case, the first unlocking projections 76 provided on both sides in the direction of width of the first connectors 71 respectively push the latch arms 42 provided on both sides in the direction of width of the covers 40 outward via the second release projections 44 of these latch arms 42. As a result, the unlocking of the second connectors 50 from the first projections 43 is initiated. Note, that in this state, the locks 75 of the first connectors 71 have respectively ridden over the locking projections 54 of the second connectors 50, and the locking projections 54 have respectively entered the openings 75a, so that the locked state of the first and second connectors 71, 50 is maintained.

When the circuit units 60 are caused to advance further, the first unlocking projections 76, provided on both sides in the direction of width of the first connectors 71 respectively, ride over the second release projections 44 of the latch arms 42, which are provided on both sides in the direction of width of the covers 40, and the latch arms 42 return to the original positions. Then, the second projections 52, on both sides in the direction of width of the second connectors 50 respectively, move rearward together with the second connectors 50, and are positioned on the rear side of the first projection 43, which are provided on the latch arms 42 on both sides in the direction of width of the covers 40. As a result, releasing the second connectors 50 from the first projections 43 is completed. When releasing the second connectors 50 from the first projections 43 is completed, the second connectors 50 can respectively slide inside the connector accommodating recess 41 in the direction of insertion and withdrawal of the circuit units 60.

Figure 18:
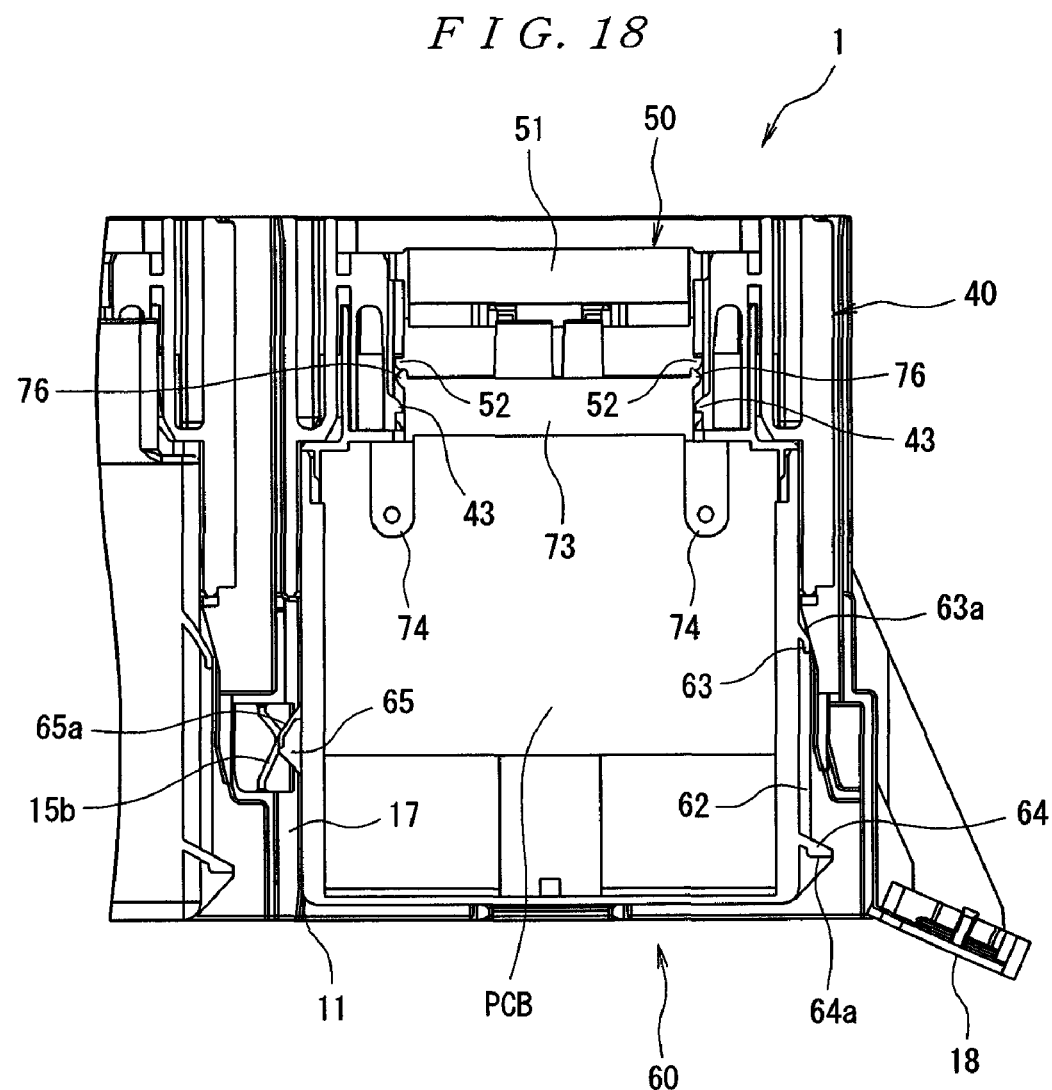
FIG. 18 is a sectional view showing a state in which the circuit unit has been inserted into the second position, and the accommodation of the circuit unit in the circuit unit accommodation box has been completed.
Figure 19:
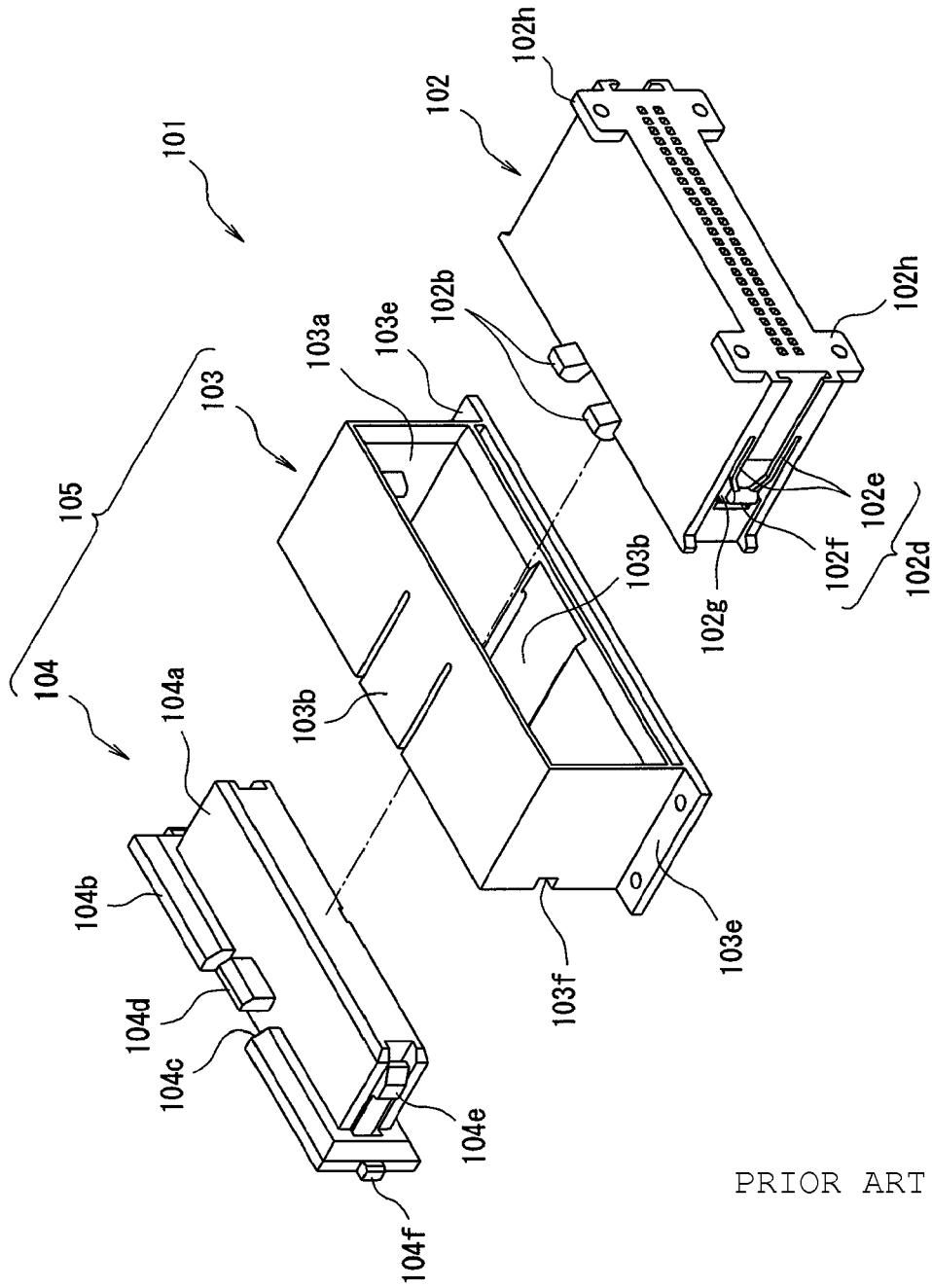
FIG. 19 is a perspective view of the assembly of a conventional example of a connector device having a receptacle electrical connector.
Figure 20:
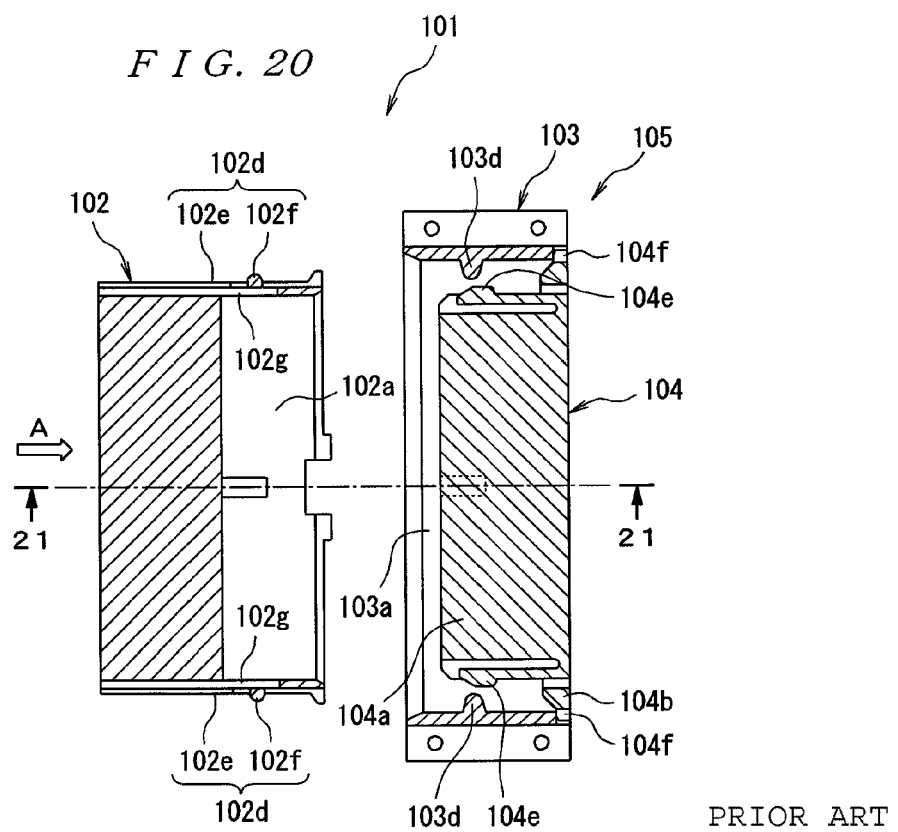
FIG. 20 is a sectional view showing a state in which the second connector is accommodated in the receptacle part in the connector device, shown in FIG. 19, and shown together with the first connector.
Figure 21:
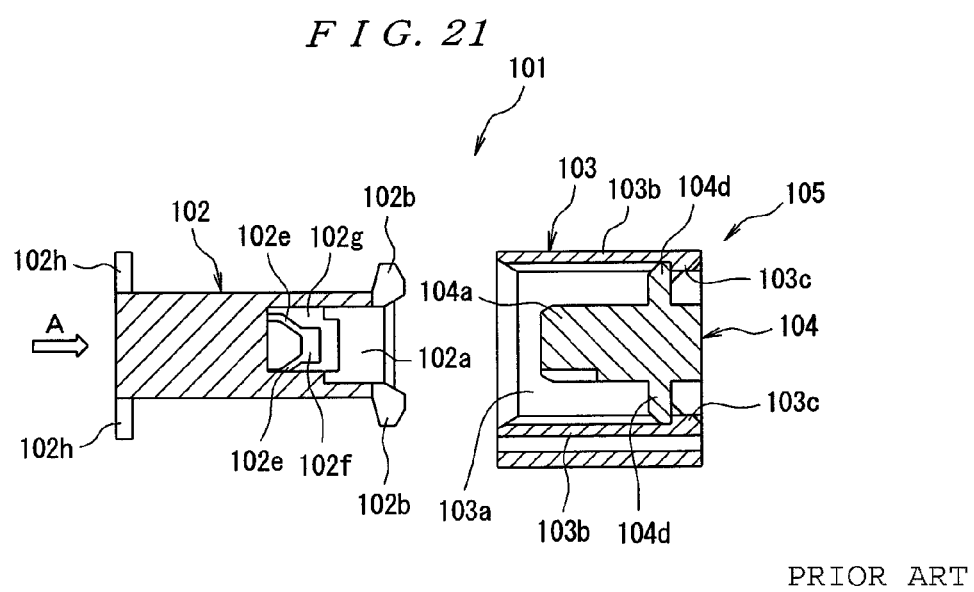
FIG. 21 is a sectional view along line 21-21 in FIG. 20.
Figure 22:
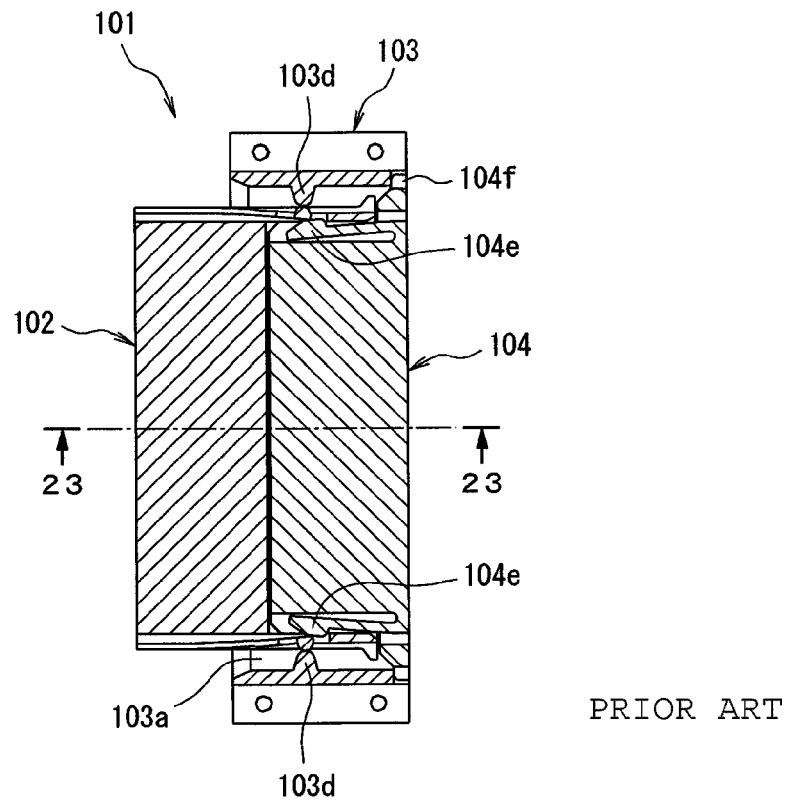
FIG. 22 is a sectional view of the connector device shown in FIG. 21 at an intermediate point during mating.
Figure 23:
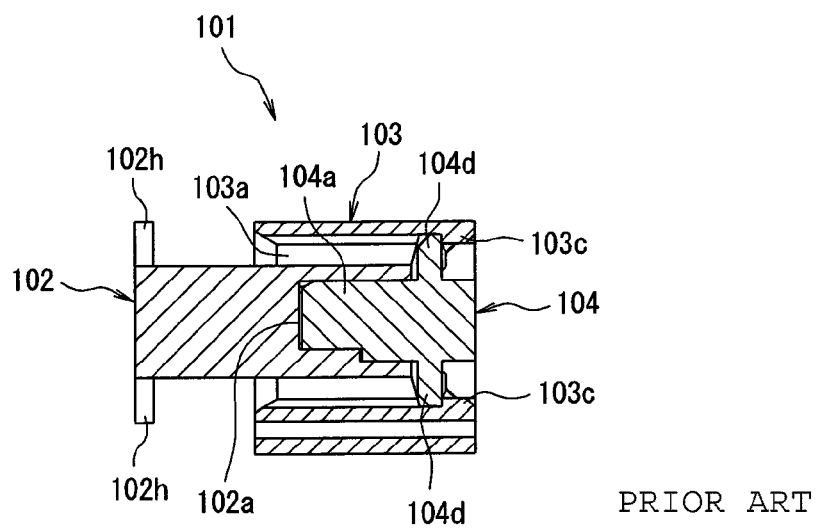
FIG. 23 is a sectional view along line 23-23 in FIG. 22.
Figure 24:
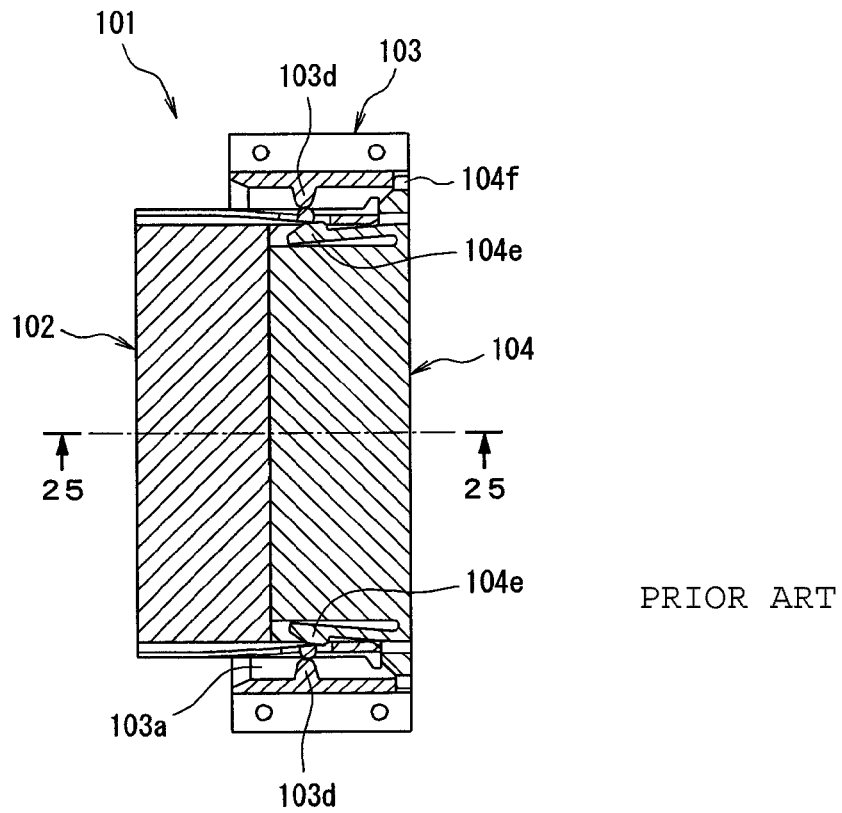
FIG. 24 is a sectional view of the connector device shown in FIG. 22 at an intermediate point during mating.
Figure 25:
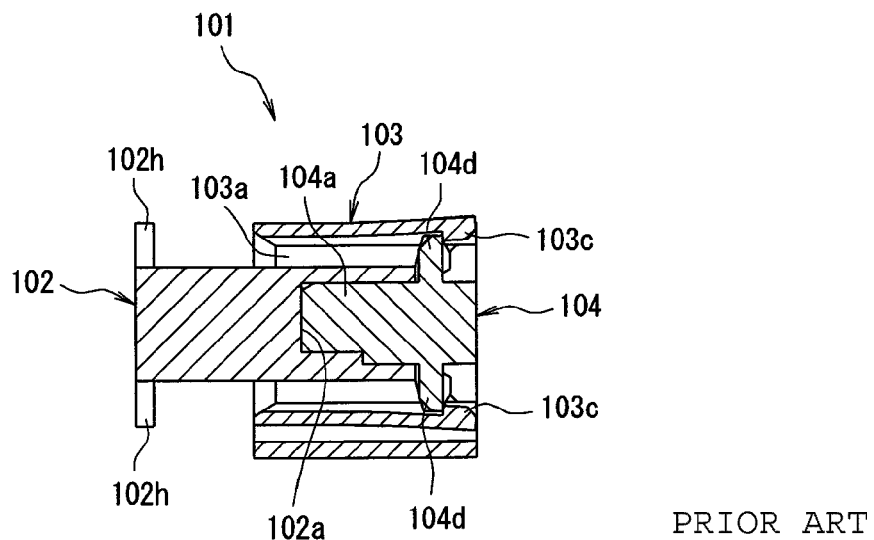
FIG. 25 is a sectional view along line 25-25 in FIG. 24.
Figure 26:
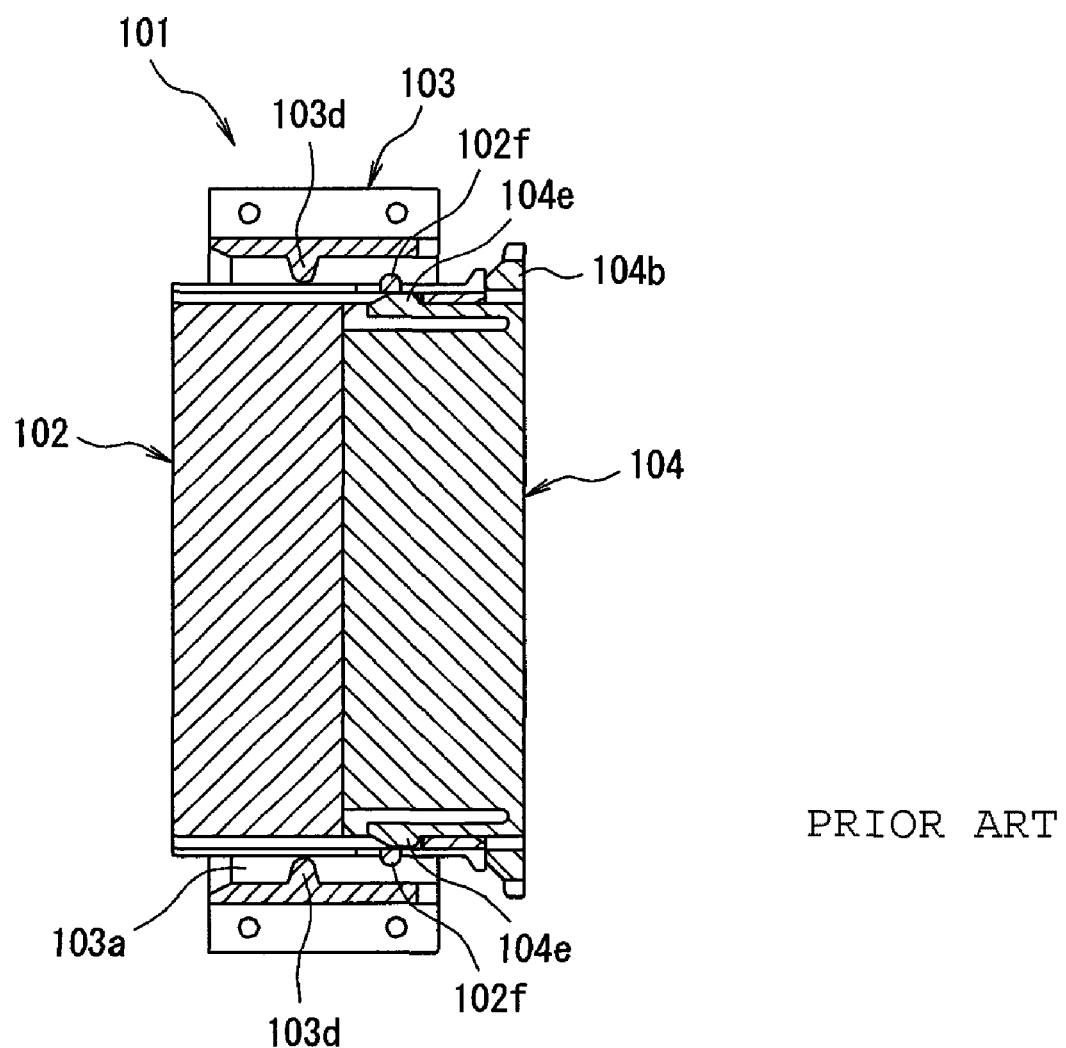
FIG. 26 is a sectional view of the completed state of mating of the connector device shown in FIG. 24.

Then, when the respective circuit units 60 are caused to advance further, a state is created in which the circuit units 60 have been inserted into the specified final position, i.e., the second position, as shown in FIG. 18. In this state, the inclined surface 63a of the first rib 63 provided on the right side wall of each circuit unit 60 engages with the first spring 15a (provided on the right side wall of the corresponding circuit unit accommodating recess 11 of the box body 10) so that the circuit unit 60 is driven toward the front and toward the left. Likewise, as is shown in FIG. 18, the inclined surface 65a of the third rib 65 provided on the left side wall of each circuit unit 60 engages with the second spring 15b (provided on the left side wall of the corresponding circuit unit accommodating recess 11 of the box body 10), so that the circuit unit 60 is driven toward the front and toward the right. Furthermore, the lock 16, which is provided on the right side wall of each circuit unit accommodating recess 11 of the box body 10, is locked with the perpendicular surface 64a of the second rib 64 that is provided on the right side wall of the corresponding circuit unit 60, so that the forward movement of the circuit unit 60 is restricted. As a result, the circuit unit 60 is held in the box body 10. Here, the circuit unit 60 is driven in the leftward direction by the first spring 15a and driven in the rightward direction by the second spring 15b, so that it is possible to prevent wobbling in the left-right direction (direction of width) of the circuit unit 60 with respect to the box body 10.

Moreover, the circuit unit 60 is driven toward the front by the first spring 15a and second spring 15b, and the forward movement is restricted by the lock 16, so that it is possible to prevent wobbling in the front-back direction of the circuit unit 60 as well with respect to the box body 10.

Moreover, in the circuit unit accommodation box 1 of the present embodiment, when the circuit units 60 comprising the first connectors 71 are respectively inserted into the circuit unit accommodating recess 11 of the box body 10 to the first position, the first connectors 71 mate with the second connectors 50 of the corresponding receptacles 30, so that the first connectors 71 and the second connectors 50 are electrically connected. Then, when the circuit units 60 are inserted into the second position, the circuit units 60 are held in the box body 10 by the securing mechanism composed of the first spring 15a, second spring 15b, and lock 16 that are provided on the box body 10 and the first ribs 63, third ribs 65, and second ribs 64 that are provided on the circuit units 60. Therefore, it is possible to provide a circuit unit accommodation box 1 that can reliably accommodate the circuit units 60 having the first connectors 71.

In addition, the circuit units 60 can be attached to the circuit unit accommodation box 1 by merely inserting the circuit units 60 into the box body 10, so that it is possible to attach the circuit units 60 to the circuit unit accommodation box 1 with a simple operation and to also electrically connect the first connectors 71 of the circuit units 60 and the second connectors 50 on the side of a vehicle body.

Furthermore, the first position, in which the first connectors 71 and the second connectors 50 mate with each other, is different from the second position, in which the circuit units 60 are held in the box body 10. Furthermore, the insertion force required for the mating of the connectors and the insertion force required for securing or locking the circuit units 60 in the box body 10 are different from each other. Therefore, the worker can easily perceive when the attachment of the circuit units 60 to the circuit unit accommodation box 1 is completed, simply by sensation.

Moreover, the two insertion forces described above are different and required sequentially so that the peak value (maximum value) of each of the forces is smaller than that in a case in which the peaks values overlap, so that workability is favorable.

Meanwhile, it would also be possible to produce sensation as if the force had only one peak by respectively adjusting the first position and second position, as well as the maximum values of each peak force. In this case, attachment is completed simply by pushing the circuit units 60 into the circuit unit accommodation box 1 against a single peak in the insertion force, so that there is no need for the worker to confirm that the second peak insertion force is perceived following the first peak insertion force. Therefore, failure in the mating of the circuit units 60 with the circuit unit accommodation box 1 is more easily prevented.

In addition, the first windows 19a, allowing the viewing of the state of engagement of the first spring 15a with the first ribs 63 of the corresponding circuit units 60, are formed in the upper wall and lower wall of the box body 10. Likewise, the second windows 19b, allowing the viewing of the state of engagement of the second spring 15b with the third ribs 65 of the corresponding circuit units 60, are formed in the upper wall and lower wall of the box body 10. Therefore, depending on the mounted state of the circuit unit accommodation box 1, it is possible to view the state when the circuit units 60 are held in the second position from the first windows 19a and second windows 19b, while also confirming that the circuit units 60 are firmly mounted to the circuit unit accommodation box 1.

Furthermore, because the box body 10 includes the attachments 18 for a vehicle body, the circuit unit accommodation box 1 can be attached to the vehicle body. Moreover, because the second connectors 50 are respectively attached inside the covers 40 from the direction opposite to the circuit unit insertion direction (i.e., the direction indicated by arrow A in FIGS. 15 and 16), the second connectors 50 at the wire harness end can be combined with the box body 10 before the circuit units 60 are respectively assembled to the circuit unit accommodation box 1 when the circuit unit accommodation box 1 is to be attached to the vehicle body. As a result, man-hours in the assembly work of the circuit units 60 can be reduced, and half-mating of the first connectors 71 with the second connectors 50 can be prevented.

An embodiment of the present invention has been described above. However, the present invention is not limited to this embodiment, and various alterations and modifications can be made.

For example, it is sufficient if the securing mechanism for holding the circuit units 60 in the box body 10 hold the circuit units 60 in the box body 10 when these circuit units 60 are inserted from the first position to the second position; it is not absolutely necessary to construct the securing mechanism from the first spring 15a, second spring 15b, and lock 16 that are respectively provided on the box body 10 and the first ribs 63, third ribs 65, and second ribs 64 that are respectively provided on the circuit units 60.

Furthermore, the box body 10 has four circuit unit accommodating recesses 11 in the present embodiment, but there may be any number of circuit unit accommodating recesses 11 as long as the number is one or more.

What is claimed is:

1. A circuit unit accommodation box comprising: a box body having at least one circuit unit accommodating recess into which a circuit unit equipped with a first connector is inserted and an opening formed in an upper-lower partition wall disposed in the at least one circuit unit accommodating recess; a receptacle that is disposed in the circuit unit accommodating recess and that makes an electrical connection with the inserted circuit unit and has a cover with a locking projection that engages the opening formed in the upper-lower partition wall; a second connector accommodated inside the cover such that the second connector mates with the first connector and establishes electrical connection with the first connector when the received circuit unit is inserted into a first position; a release projection for releasing the second connector from the locking projection when the circuit unit is inserted from the first position into a second position further toward the interior withdrawal of the circuit unit after the second connector is released by the release projection; and
   a securing mechanism on the box body and the circuit unit for holding the circuit unit in the box body when the circuit unit is inserted from the first position to the second position.

2. The circuit unit accommodation box according to claim 1, wherein the box body is provided with a window that allows the viewing of the state of the circuit unit being held by the securing mechanism.

3. The circuit unit accommodation box according to claim 1, wherein the box body comprises an attachment part for a vehicle body.

4. The circuit unit accommodation box according to claim 3, wherein the second connector is attached inside the cover from the direction opposite of the circuit unit insertion direction.

5. The circuit unit accommodation box according to claim 2, wherein the box body comprises an attachment for a vehicle body, and the second connector is attached inside the cover from the direction opposite of the circuit unit insertion direction.

6. A receptacle for a circuit unit accommodating box, comprising: a cover disposed in the receptacle for receiving the circuit unit and guiding the circuit unit to a specified position and having a locking projection disposed on an upper wall of the cover for locking the cover in a box body of the circuit unit accommodating box by entering a first opening of the box body and a first projection disposed on an interior of the cover; a second connector accommodated inside the cover and locked with the cover by a second projection that engages the first projection of the cover such that the second connector mates with a first connector and establishes electrical connection with the first connector when the received circuit unit is inserted into a first position; and
    a release projection for releasing the second connector from the first projection when the circuit unit is inserted from the first position into a second position further toward the interior, with the second connector slidable inside the cover in the direction of insertion and withdrawal of the circuit unit after the second connector is released by the release projection.

7. A circuit unit box comprising:
a first spring and a lock disposed on a side wall of a circuit unit accommodating recess, the spring being engageable with a front rib and with a rear rib;
a receptacle disposed in the circuit unit accommodating recess being electrically connectable with a circuit unit connector;
a cover disposed in the receptacle;
a second connector accommodated inside the cover and locked with the cover by locking projections, the second connector being mateable with the circuit unit connector; and
a release projection for releasing the second connector from the locking projections when the circuit unit is advanced from a first position to a second position, the second connector being slidable inside the cover upon release of the second connector from the locking projections.

* * * * *

UNITED STATES PATENT AND TRADEMARK OFFICE
CERTIFICATE OF CORRECTION

| | |
|---|---|
| PATENT NO. | : 8,212,145 B2 |
| APPLICATION NO. | : 12/442342 |
| DATED | : July 3, 2012 |
| INVENTOR(S) | : Ryuichi Nagai et al. |

Page 1 of 1

It is certified that error appears in the above-identified patent and that said Letters Patent is hereby corrected as shown below:

On the title page of the Patent, item (22) PCT Filed: date delete "August 8, 2007 and insert --August 28, 2007-- therefore.

In the claims:
In column 14, line 55, after the word "interior" insert --, with the second connector slidable inside the cover in the direction of insertion and --.

Signed and Sealed this
Tenth Day of December, 2013

Margaret A. Focarino
*Commissioner for Patents of the United States Patent and Trademark Office*